(12) United States Patent
Liu et al.

(10) Patent No.: US 11,127,688 B2
(45) Date of Patent: Sep. 21, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Zi-Jheng Liu, Taoyuan (TW); Hung-Jui Kuo, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,611

(22) Filed: Aug. 22, 2019

(65) Prior Publication Data
US 2021/0057347 A1  Feb. 25, 2021

(51) Int. Cl.
| H01L 23/00 | (2006.01) |
|---|---|
| H01L 23/538 | (2006.01) |
| H01L 23/31 | (2006.01) |
| H01L 21/48 | (2006.01) |
| H01L 21/56 | (2006.01) |
| H01L 21/683 | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2224/214* (2013.01)

(58) Field of Classification Search
None
See application file for complete search history.

(56) References Cited

U.S. PATENT DOCUMENTS

| 9,000,584 | B2 | 4/2015 | Lin et al. |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2011/0272664 | A1* | 11/2011 | Tada ............ H01L 45/04 257/4 |

(Continued)

*Primary Examiner* — Reema Patel
(74) *Attorney, Agent, or Firm* — JCIPRNET

(57) ABSTRACT

A semiconductor package includes a semiconductor die and a redistribution structure. The redistribution structure is electrically connected to the semiconductor die. The redistribution structure includes dielectric layers, conductive traces and seal patterns. The conductive traces are embedded in the dielectric layers. At least one conductive trace of the conductive traces includes a via pattern and a routing pattern. The seal patterns are disposed on the conductive traces. One seal pattern of the seal patterns is disposed between a top surface of the routing pattern and a first dielectric layer of the dielectric layers.

20 Claims, 27 Drawing Sheets

(56) References Cited

U.S. PATENT DOCUMENTS

2012/0125668 A1* 5/2012 Chang ................. H05K 3/4007
174/257
2016/0020172 A1* 1/2016 Su ....................... H01L 23/5389
257/530

* cited by examiner

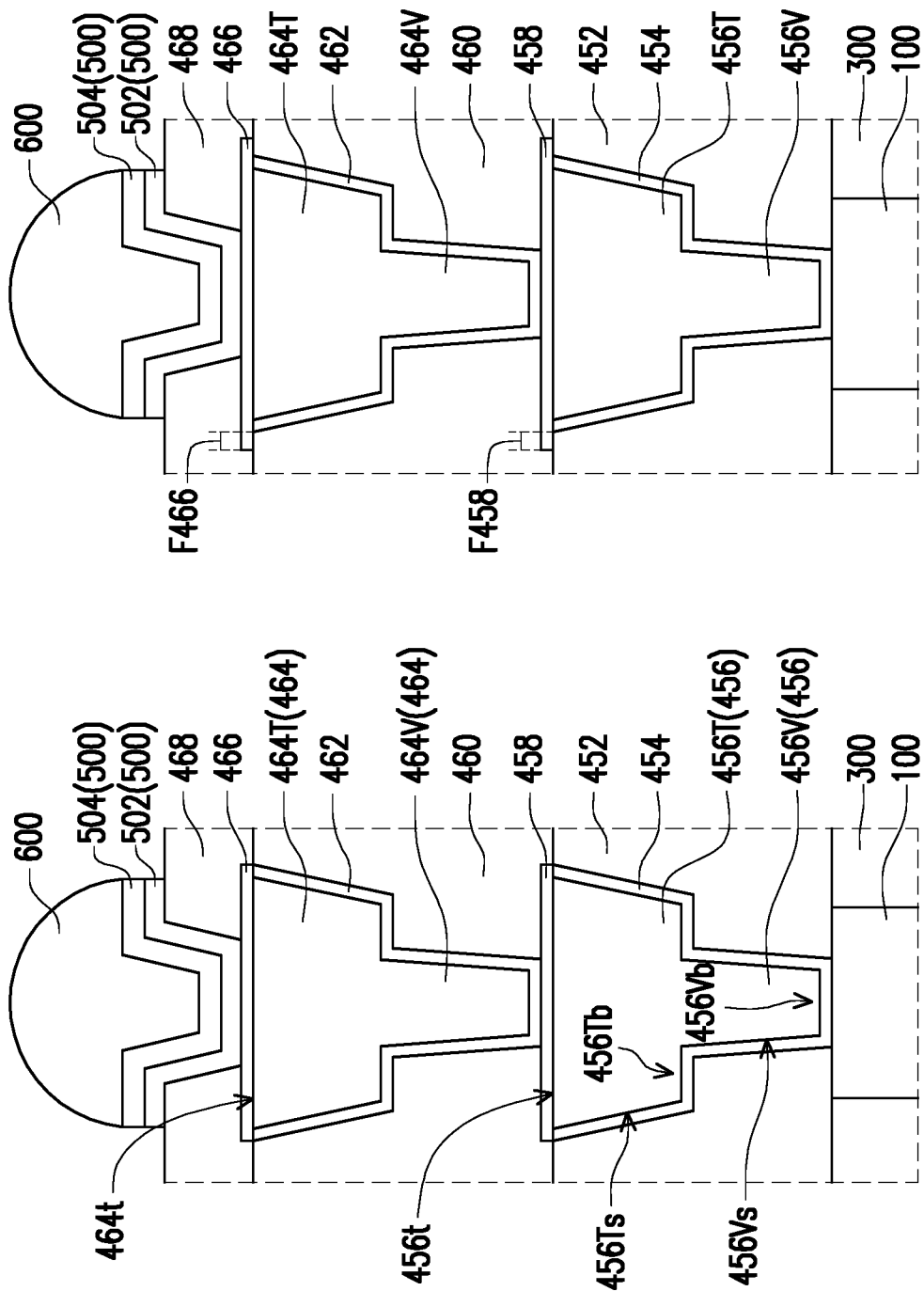

SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A and FIG. 4B are schematic cross-sectional views illustrating a portion of a semiconductor package in accordance with some embodiments of the disclosure.

DETAILED DESCRIPTION

Figure 1A:
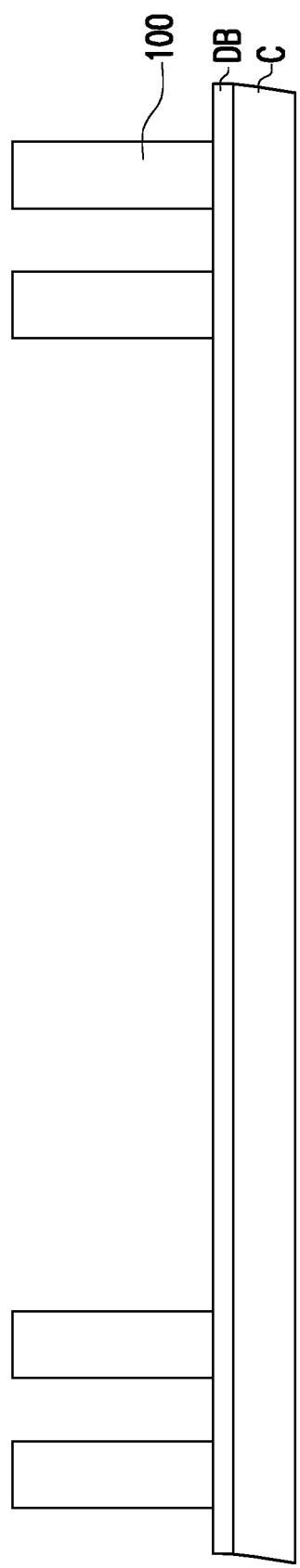
FIG. 1A to FIG. 1U are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
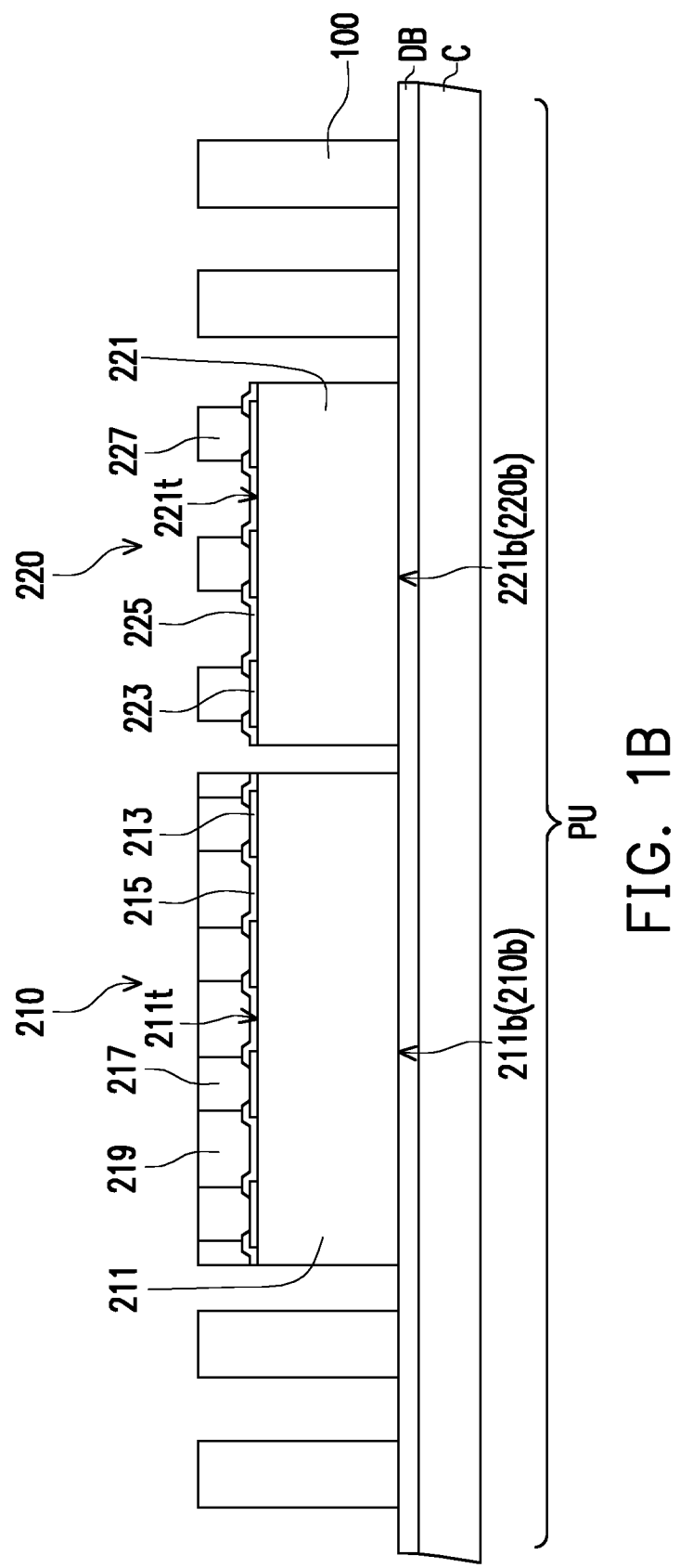
Figure 1C:
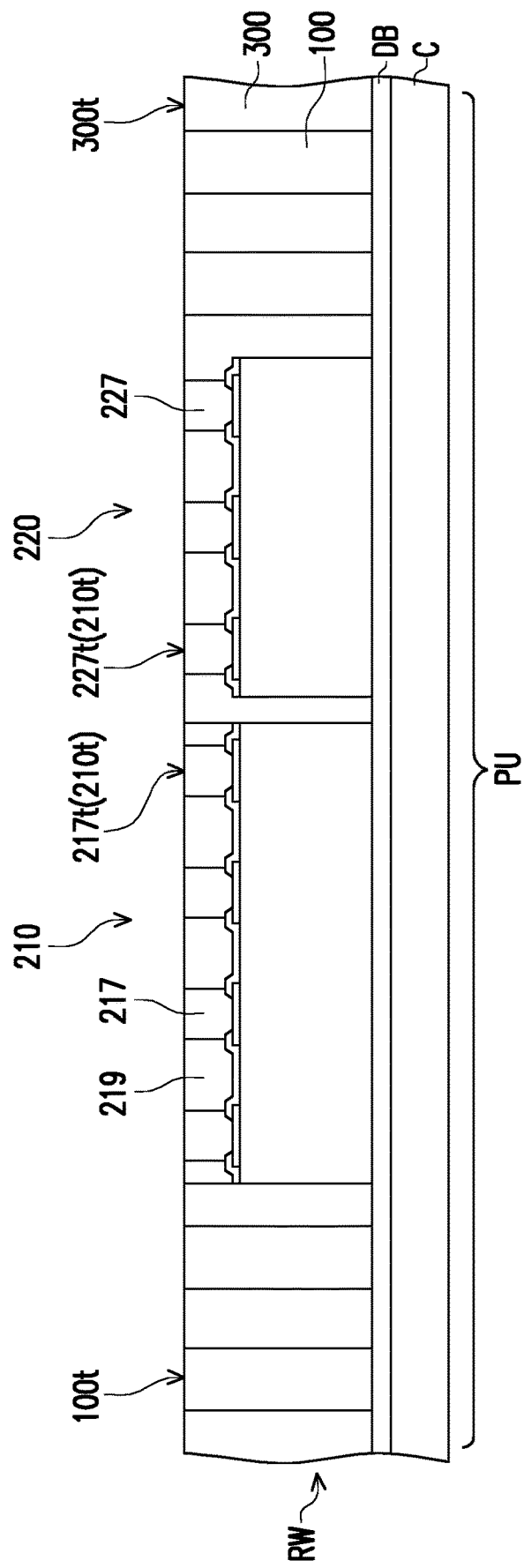
Figure 1D:
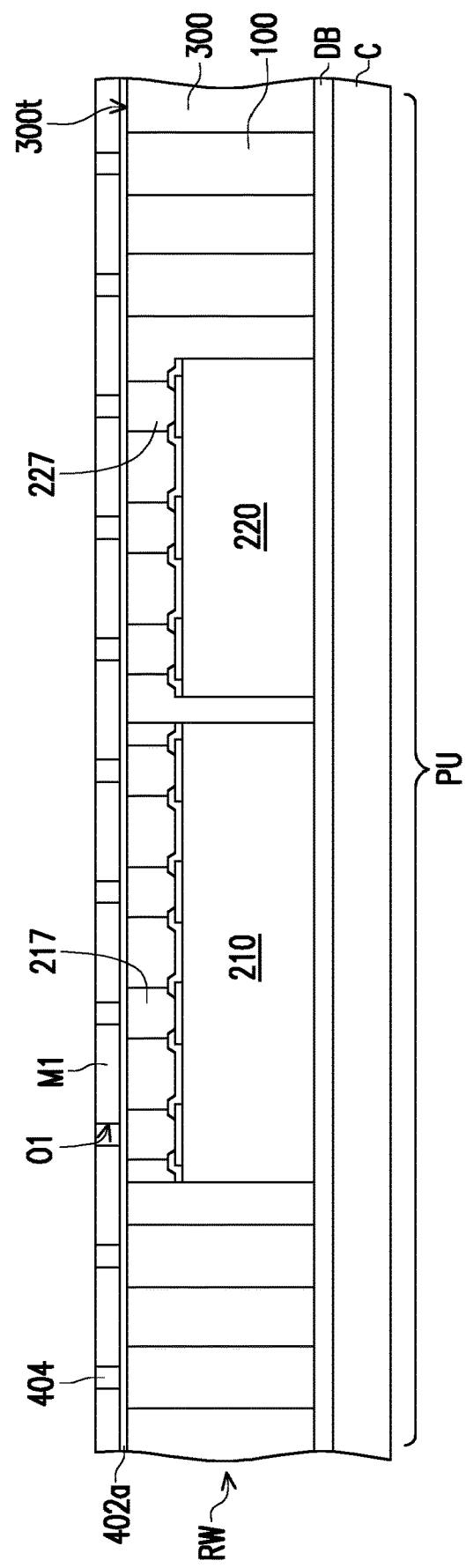
Figure 1E:
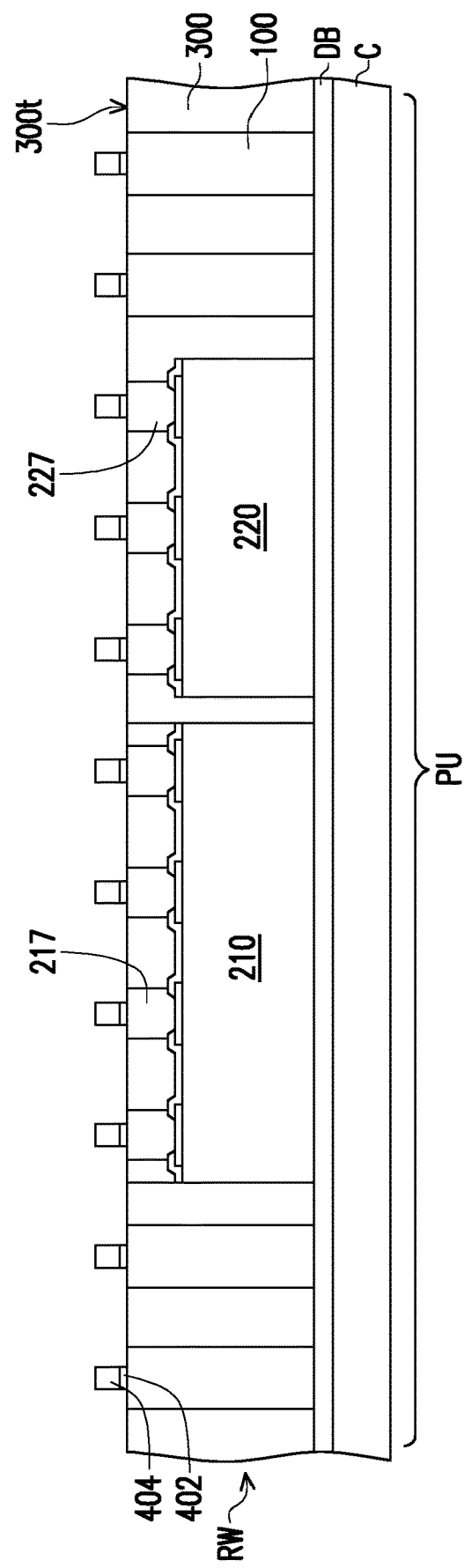
Figure 1F:
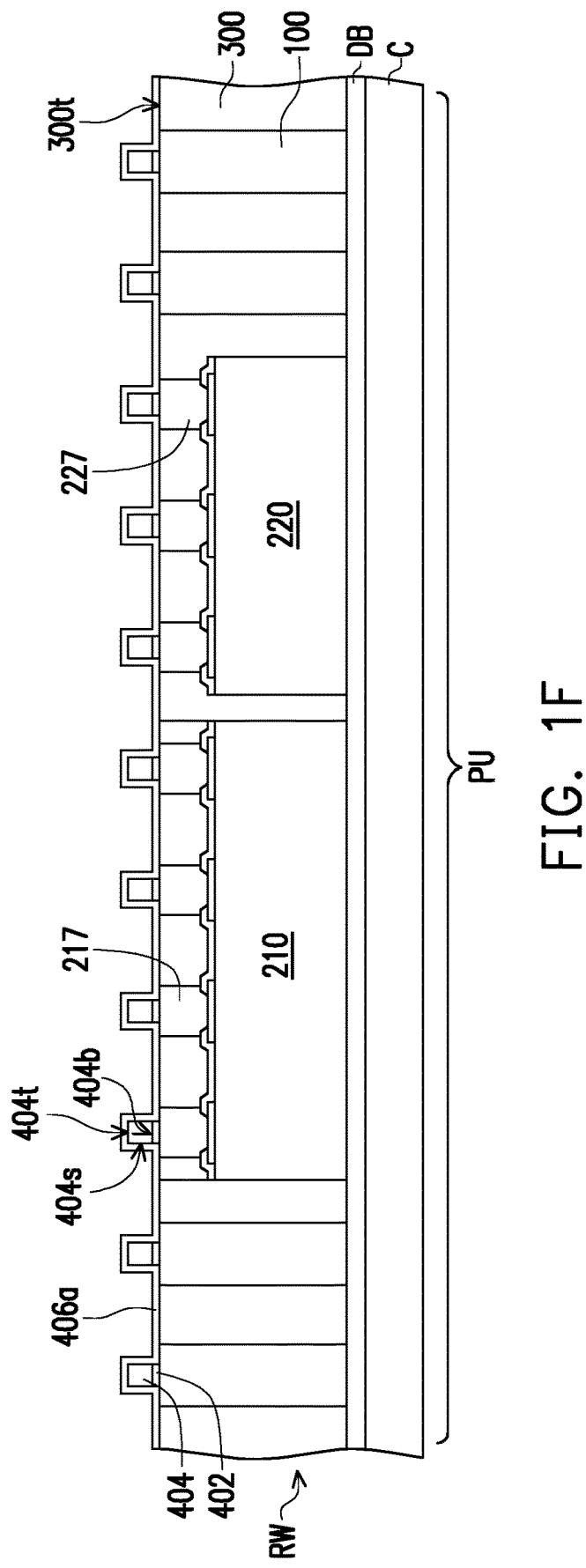
Figure 1G:
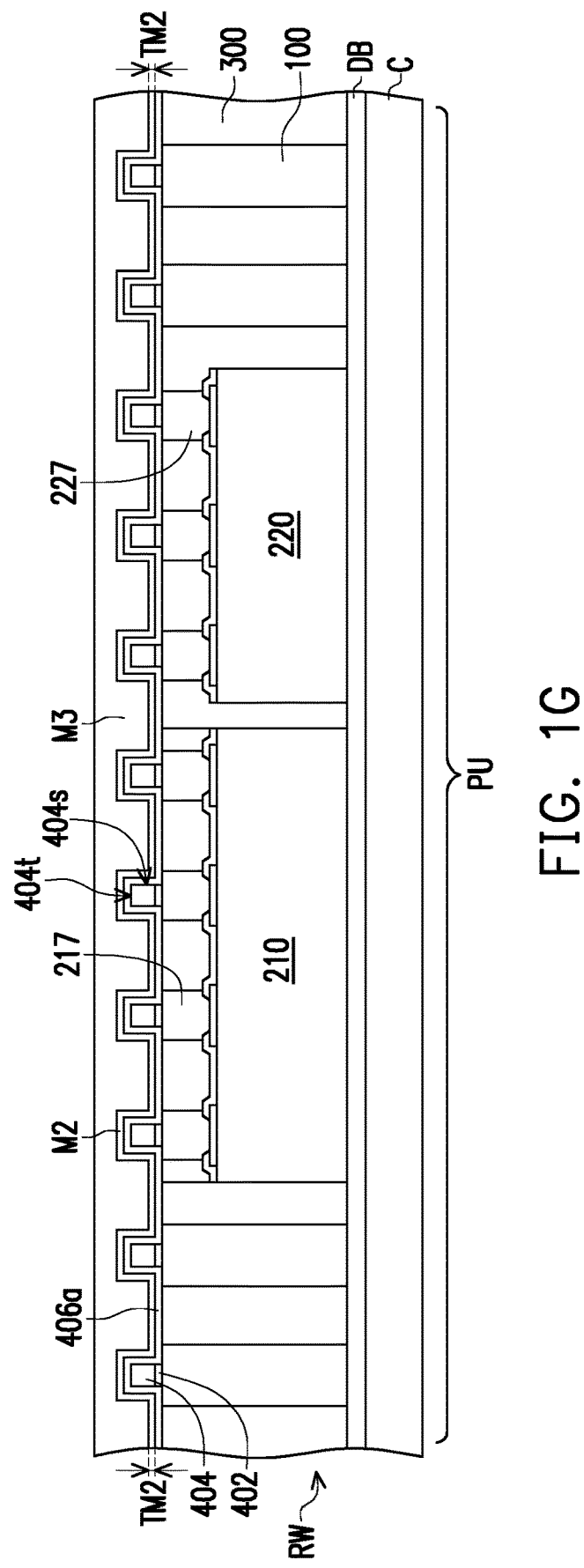
Figure 1H:
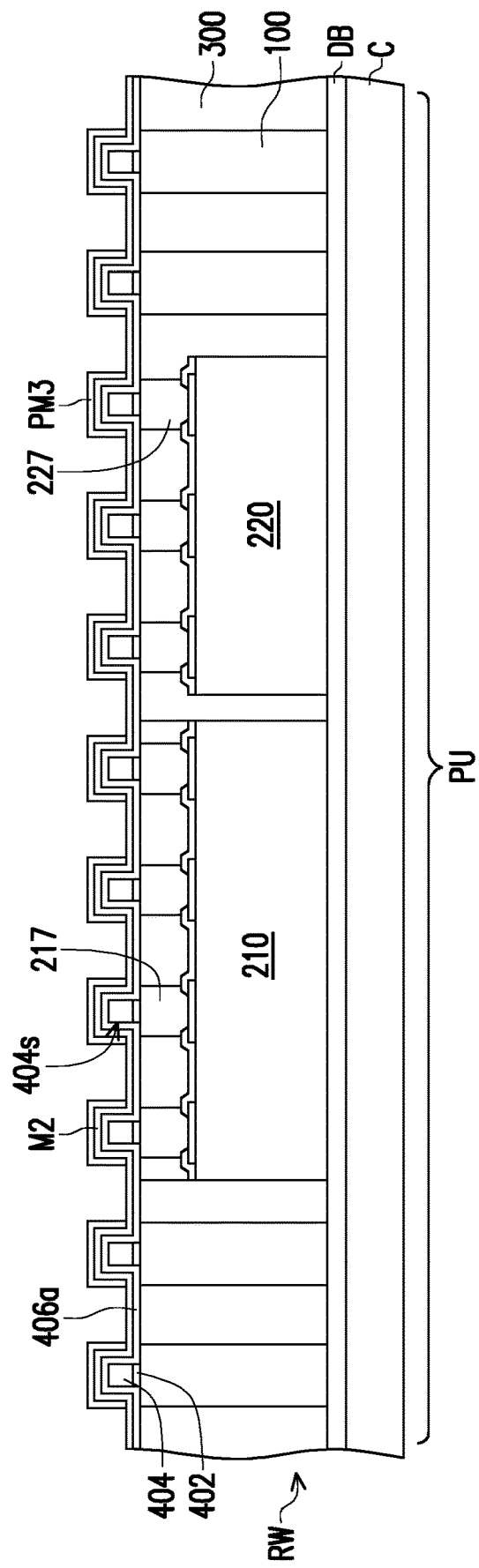
Figure 1I:
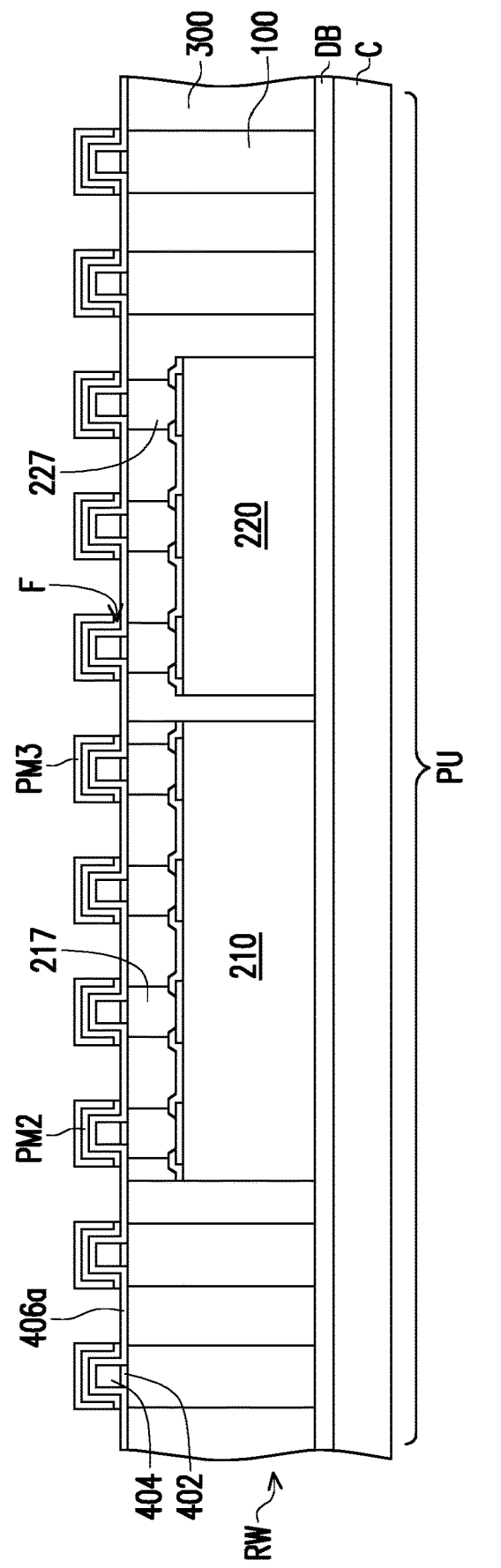
Figure 1J:
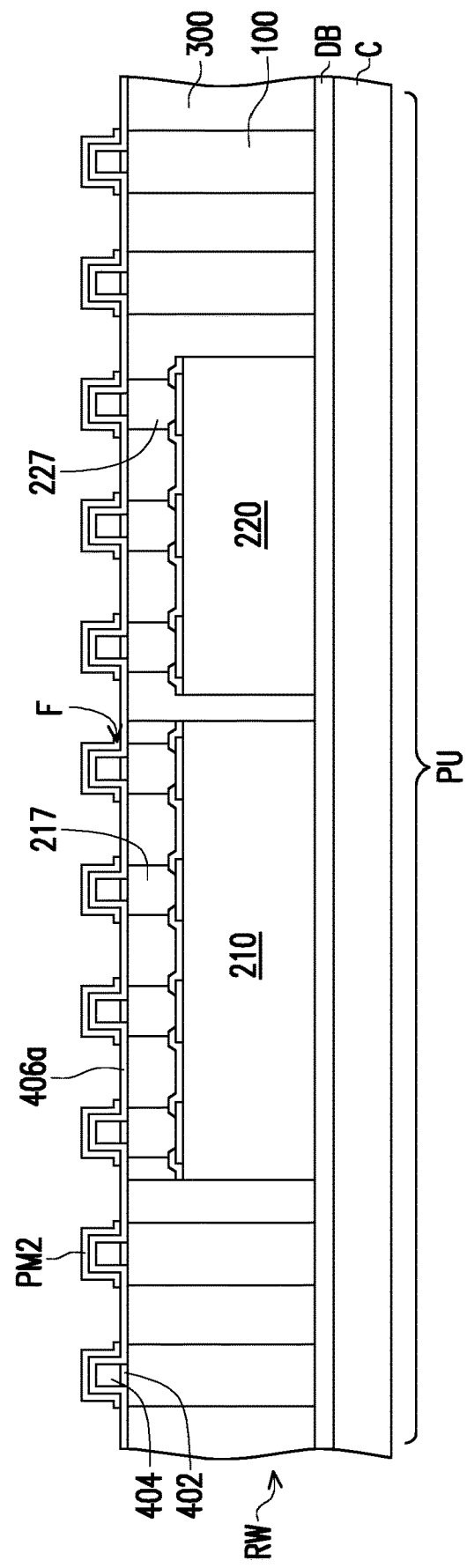
Figure 1K:
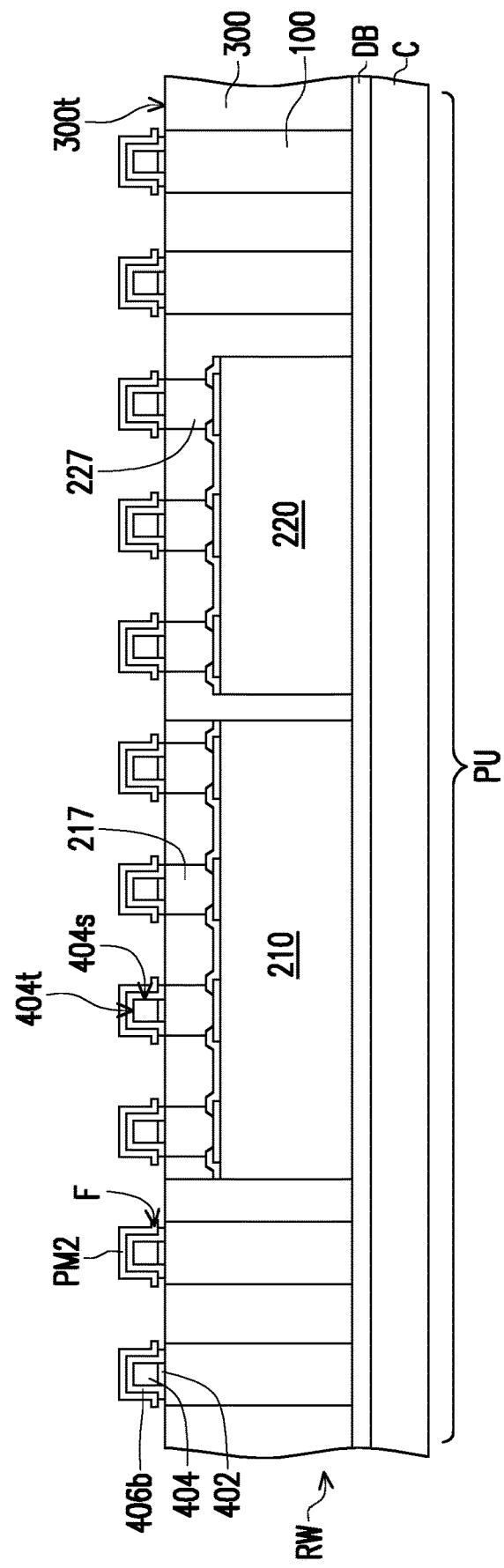
Figure 1L:
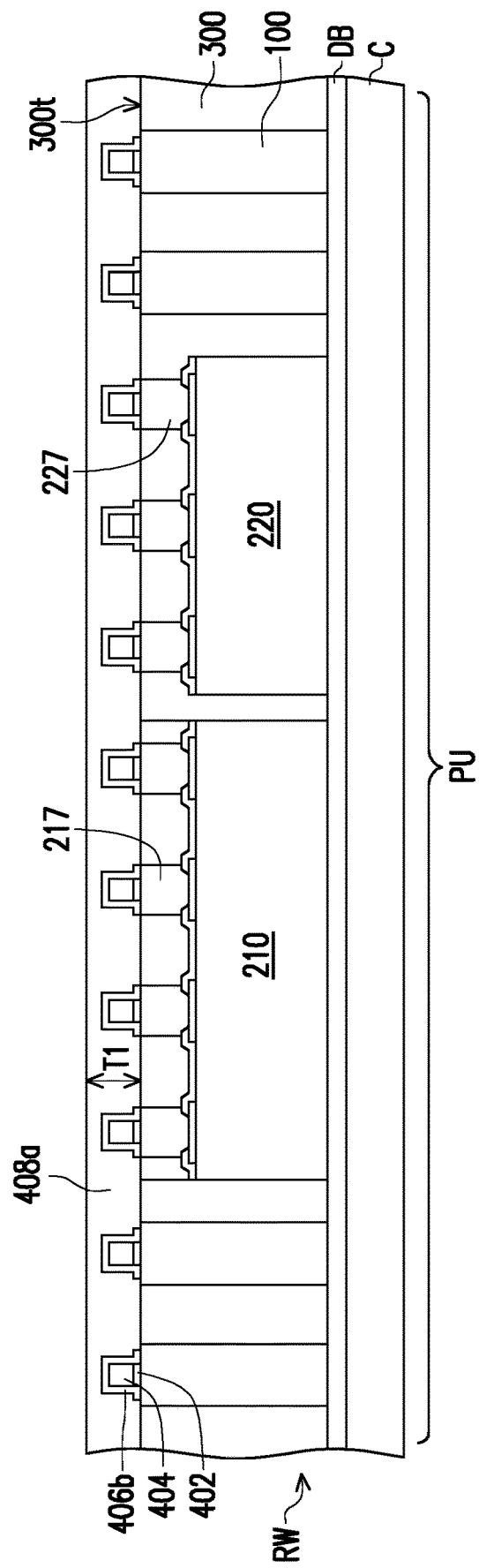
Figure 1M:
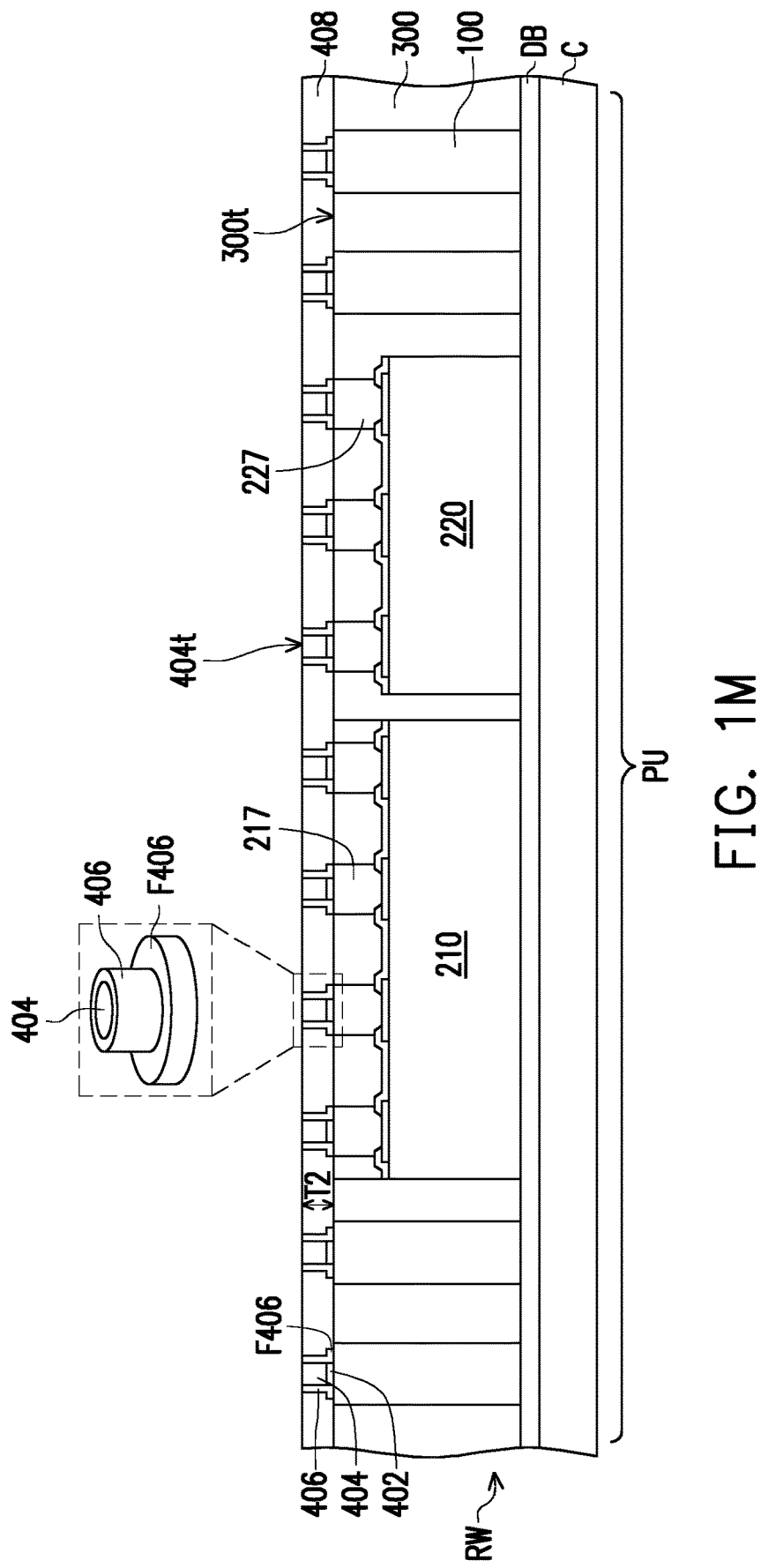
Figure 1N:
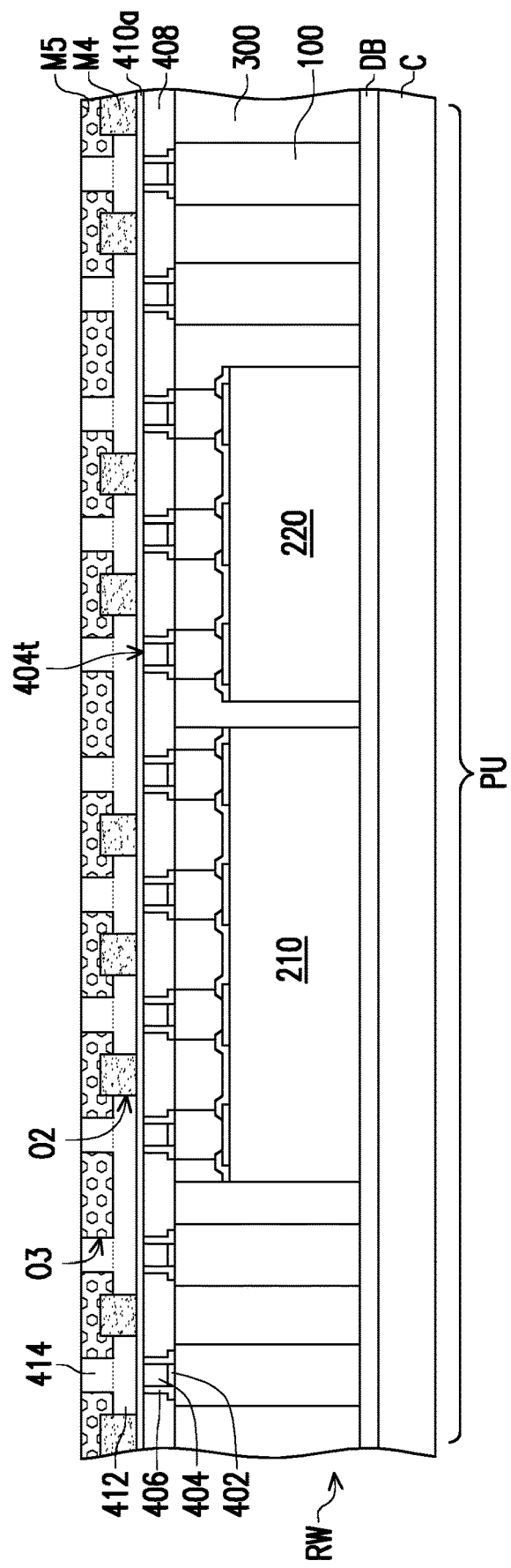
Figure 10:
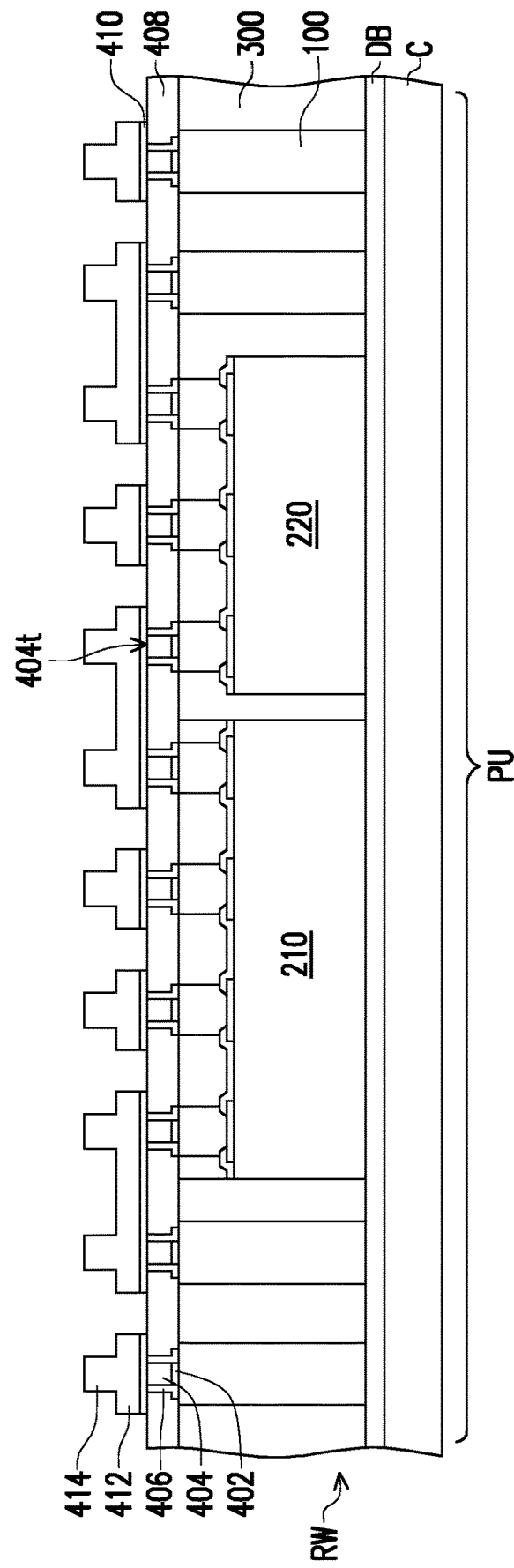
Figure 1P:
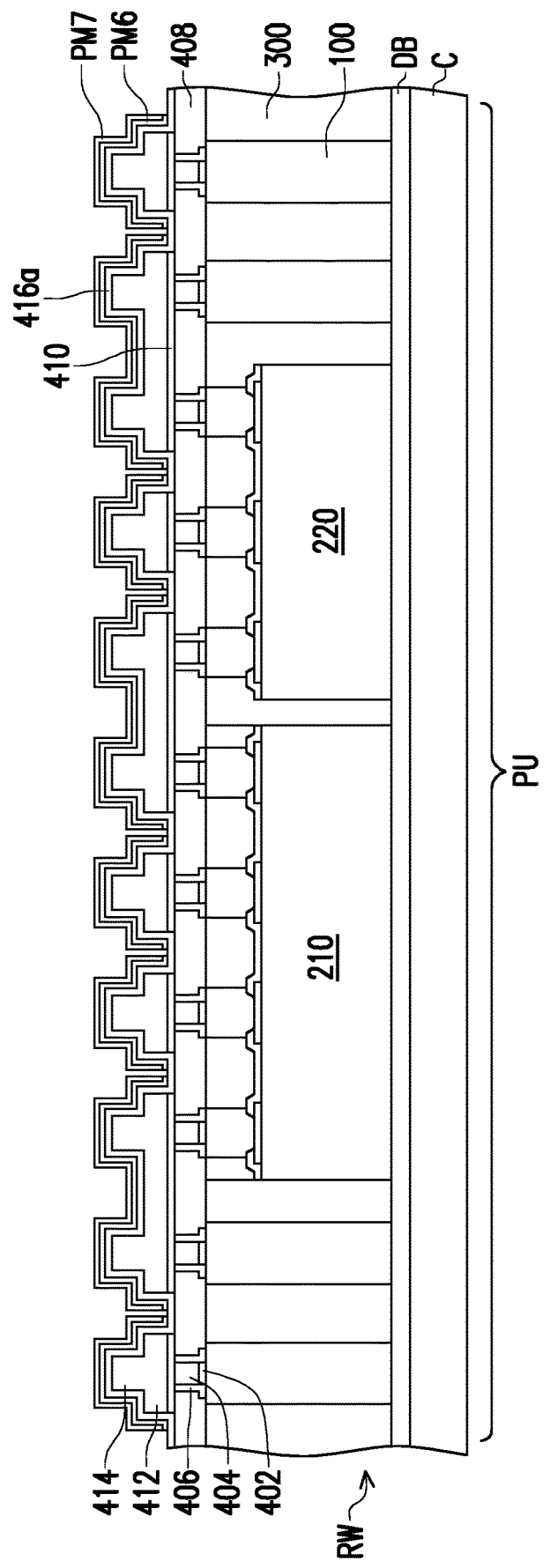
Figure 1Q:
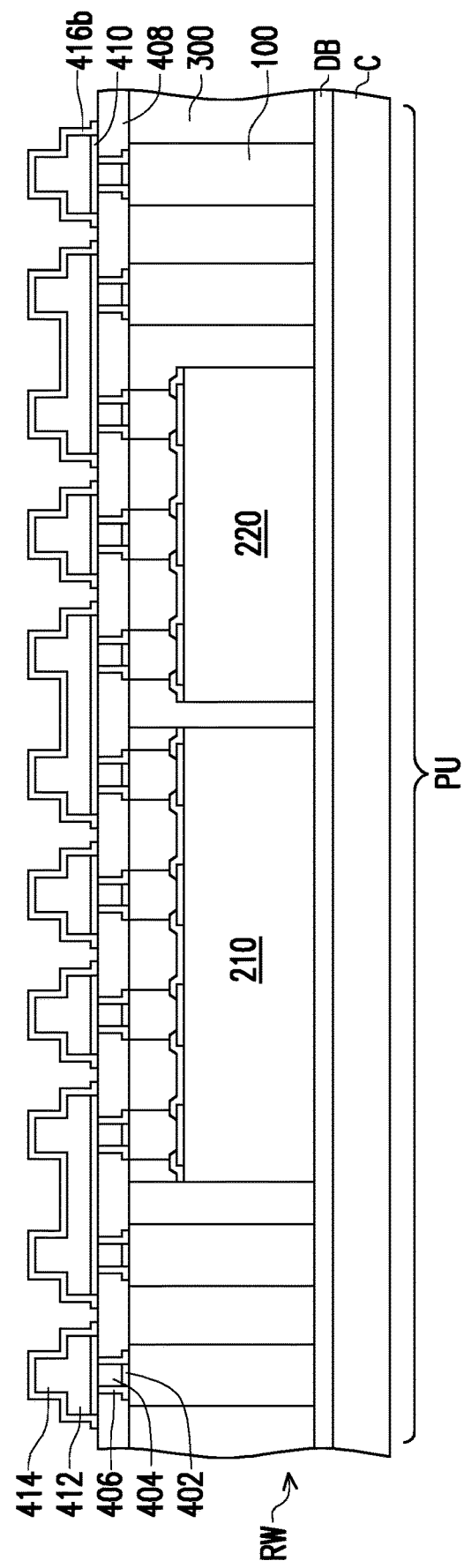
Figure 1R:
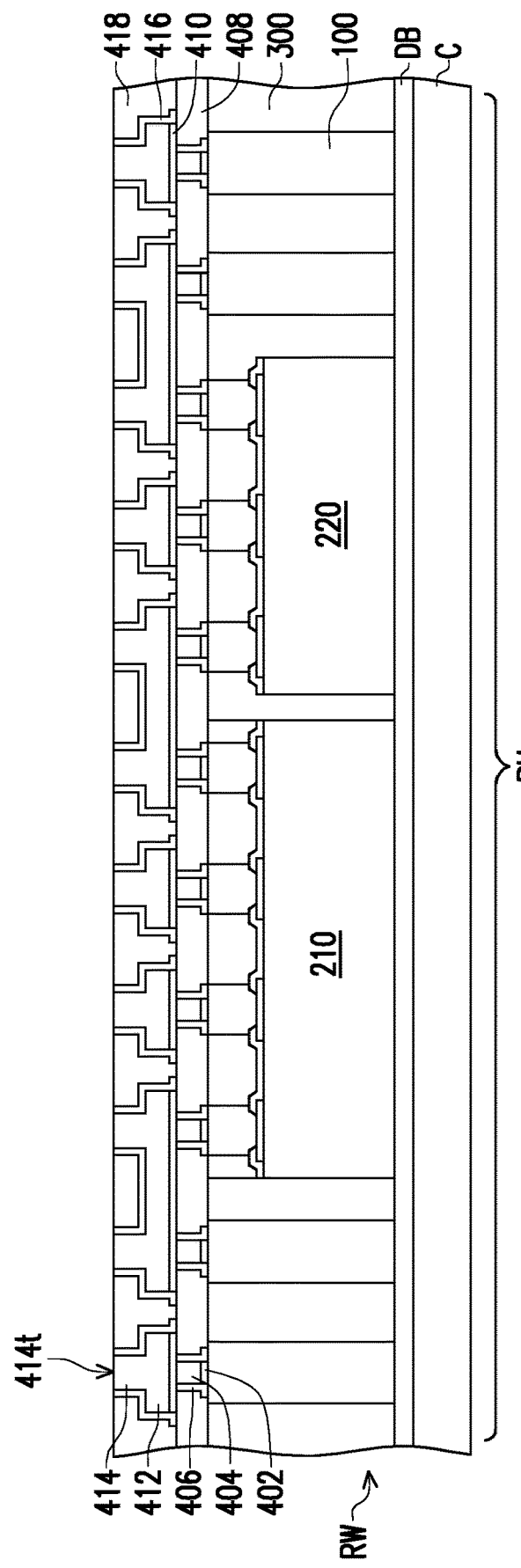
Figure 1S:
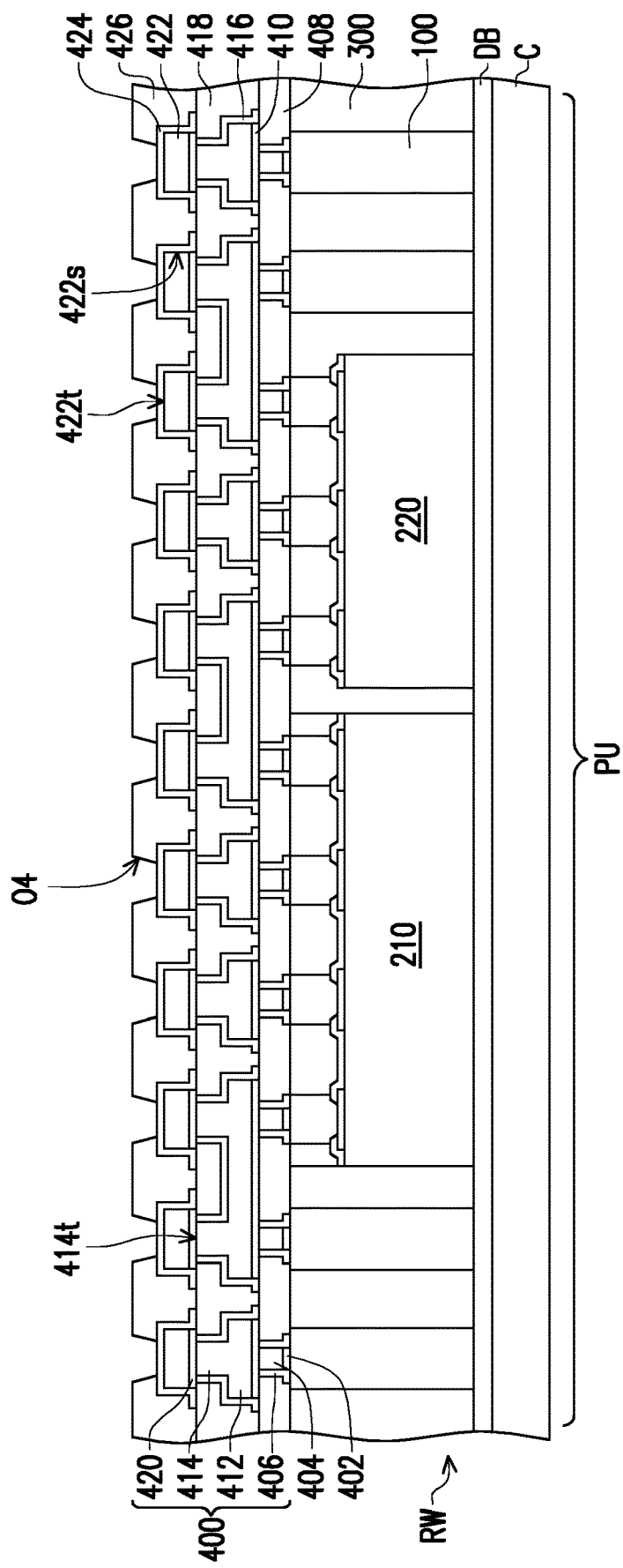
Figure 1T:
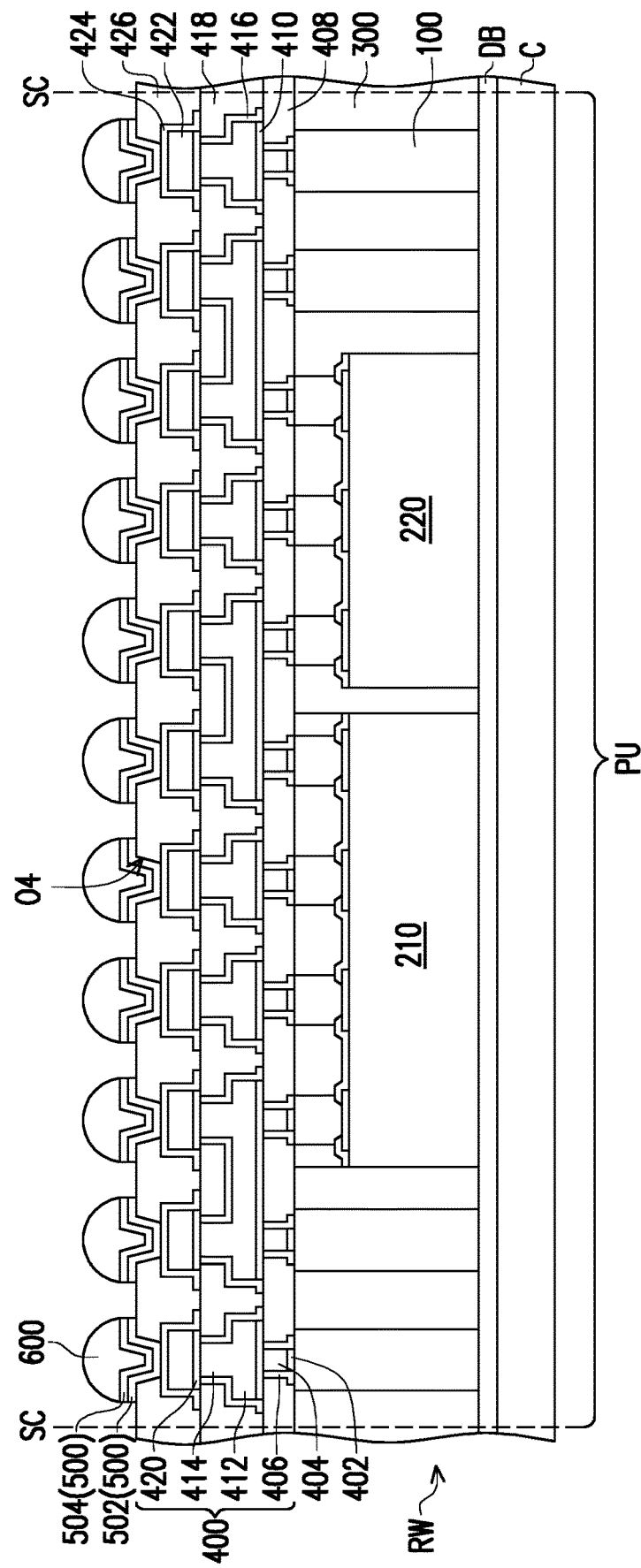
Figure 1U:
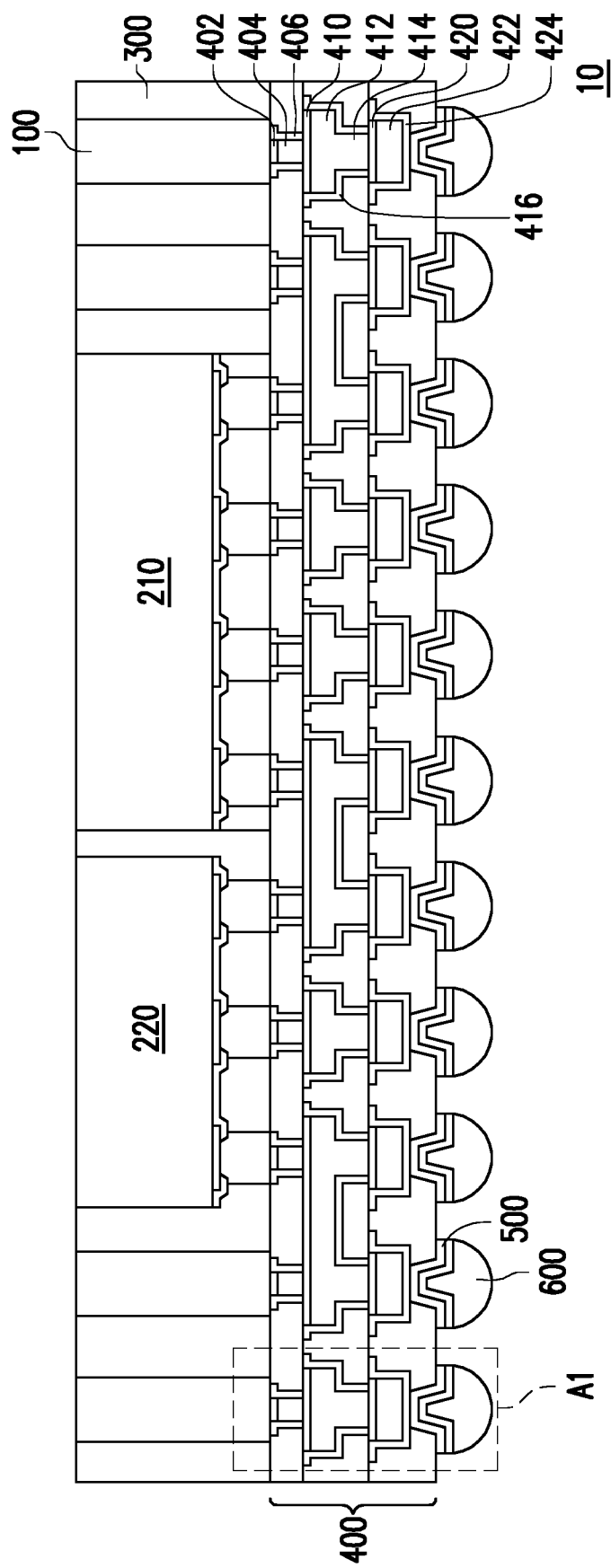

FIG. 1A to FIG. 1U are schematic cross-sectional views illustrating structures produced during a manufacturing process of a semiconductor package 10 (shown in FIG. 1U) in accordance with some embodiments of the disclosure. Referring to FIG. 1A, a carrier C may be provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer DB may be formed over the carrier C. In some embodiments, the de-bonding layer DB includes a light-to-heat conversion (LTHC) release layer, which facilitates peeling the carrier C away from the semiconductor device when required by the manufacturing process.

In some embodiments, through insulator vias (TIVs) 100 are formed on the carrier C. In some embodiments, the TIVs 100 are through integrated fan-out (InFO) vias. In some embodiments, the TIVs 100 may be formed by providing a mask pattern (not shown) on the de-bonding layer DB with openings exposing the debonding layer DB on the carrier C, forming a metallic material filling the openings to form the TIVs 100 by electroplating or deposition and then removing the mask pattern. In some embodiments, the metallic material of the TIVs 100 includes aluminum, titanium, copper, nickel, tungsten, combinations thereof, or other suitable conductive materials.

In some embodiments, referring to FIG. 1B, semiconductor dies 210, 220 are provided on the carrier C amongst the TIVs 100. In some embodiments, the semiconductor dies 210, 220 are placed onto the carrier C through a pick-and-place method. Even though only two semiconductor dies 210, 220 are presented in FIG. 1B for illustrative purposes, it is understood that a semiconductor package according to some embodiments of the disclosure may contain more than two semiconductor dies 210, 220. Furthermore, a plurality of semiconductor dies may be provided on the carrier C to produce multiple package units PU with wafer-level packaging technology.

In some embodiments, an individual semiconductor die 210 or 220 respectively includes a semiconductor substrate 211 or 221, a plurality of contact pads 213 or 223 and a passivation layer 215 or 225. The contact pads 213, 223 may be formed on the top surfaces 211t, 221t of the respective semiconductor substrates 211, 221. The passivation layers 215, 225 may cover the top surfaces 211t, 221t of the corresponding semiconductor substrates 211, 221 and have a plurality of openings that exposes at least a portion of each contact pad 213, 223. In some embodiments, the semiconductor dies 210, 220 further include a plurality of conductive posts 217, 227 respectively filling the openings of the passivation layers 215 or 225 and electrically connected to the contact pads 213 or 223. In some embodiments, the semiconductor die 210 further includes a protective layer 219 surrounding the conductive posts 217. In some embodiments, the conductive posts 217 are exposed by the protective layer 219. In some alternative embodiments, the conductive posts 217 are covered by the protective layer 219. In some embodiments, the conductive posts 227 of the semiconductor die 220 protrudes with respect to the passivation layer 225 on the top surface 221t without being embedded in a protective layer.

In some embodiments, the semiconductor dies 210, 220 are placed on the carrier C with the top surfaces 211t, 221t of the semiconductor substrates 211, 221 facing away from the carrier C. Backside surface 210b, 220b of the semiconductor dies 210, 220 may coincide with the respective bottom surfaces 211b, 221b of the semiconductor substrates 211, 221. In some embodiments, the semiconductor dies 210, 220 are disposed with the bottom surfaces 210b, 220b facing the carrier C. Portions of die attach film (not shown) may be disposed on the bottom surfaces 210b, 220b, to secure the semiconductor dies 210, 220 to the carrier C. In some embodiments, the die attach film includes a pressure adhesive, a thermally curable adhesive, or the like.

In some embodiments, the semiconductor substrates 211, 221 shown may be made of semiconductor materials, such as semiconductor materials of the groups III-V of the periodic table. In some embodiments, the semiconductor substrates 211, 221 include elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrates 211, 221 include active components (e.g., transistors or the like) and optionally passive components (e.g., resistors, capacitors, inductors, or the like) formed therein.

In certain embodiments, the contact pads 213, 223 include aluminum pads, copper pads, or other suitable metal pads. In some embodiments, the passivation layers 215, 225 may be single layer or multi-layered structures, including a silicon oxide layer, a silicon nitride layer, a silicon oxy-nitride layer, a dielectric layer formed by other suitable dielectric materials or combinations thereof. In some embodiments, the materials of the contact pads 213, 223 include copper, copper alloys, or other conductive materials, and may be formed by deposition, plating, or other suitable techniques.

Referring to FIG. 1B, each of the semiconductor dies 210, 220 included in a package unit PU may independently be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. In some embodiments, the semiconductor dies 210, 220, either one or both, include a memory die such as a high bandwidth memory die. For example, each of the semiconductor dies 210, 220 may independently be a dynamic random access memory (DRAM), a resistive random access memory (RRAM), a static random access memory (SRAM), or the like. In some embodiments, one or both of the semiconductor dies 210, 220 may be a die stack. In some embodiments, the semiconductor dies 210, 220 are the same type of dies or perform the same functions. In some embodiments, the semiconductor dies 210, 220 are different types of dies or perform different functions. The disclosure is not limited by the number or type of dies used for the semiconductor dies 210, 220 within a package unit PU.

Referring to FIG. 1C, an encapsulant 300 is formed over the carrier C to encapsulate the semiconductor dies 210, 220 and the TIVs 100. In some embodiments, a material of the encapsulant 300 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant 300 further includes fillers. The encapsulant 300 may be formed by a sequence of over-molding and planarization steps. For example, the encapsulant 300 may be originally formed by a molding process (such as a compression molding process) or a spin-coating process so as to completely cover the semiconductor dies 210, 220 and the TIVs 100. In some embodiments, the planarization of the encapsulant 300 includes performing a mechanical grinding process and/or a chemical mechanical polishing (CMP) process. In some embodiments, the planarization process is performed until the conductive posts 217, 227 of the semiconductor dies 210, 220 are exposed. In some embodiments, portions of the passivation layer 219 and the conductive posts 217, 227 may also be removed during the thinning or planarization process of the encapsulant 300. In some embodiments, following the planarization process and the thinning process, the active surfaces 210t, 220t of the semiconductor dies 210, 220 (of which the top surfaces 217t, 227t of the conductive posts 217, 227 are part), the top surfaces 100t of the TIVs 100 and the top surface 300t of the encapsulant 300 may be substantially at a same level height (be substantially coplanar). In some embodiments, the top surfaces 217t, 227t of the conductive posts 217, 227 and the top surfaces 100t of the TIVs 100 slightly protrude with respect to the level defined by the top surface 300t of the encapsulant 300. As illustrated in FIG. 1C, the encapsulant 300 laterally encapsulates the semiconductor dies 210, 220, and the TIVs 100. With the formation of the encapsulant 300, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1C, a single package unit PU is shown for simplicity but, of course, this is for illustrative purposes only, and the disclosure is not limited by the number of package units PU being produced in the reconstructed wafer RW.

In some embodiments, referring to FIG. 1D, a seed material layer 402a is provided over the TIVs 100, the semiconductor dies 210, 220 and the encapsulant 300. In some embodiments, the seed material layer 402a is blanketly formed over the package unit PU. In some embodiments, the seed material layer 402a establishes electrical contact with TIVs 100 and the semiconductor dies 210, 220 through the conductive posts 217, 227. The seed material layer 402a may be formed through, for example, a sputtering process, a physical vapor deposition (PVD) process, or the like. In some embodiments, the seed material layer 402a may include, for example, copper, tantalum, titanium, a combination thereof, or other suitable materials. In some embodiments, a barrier layer (not shown) may be deposited before forming the seed material layer 402a to prevent out-diffusion of the material of the seed material layer 402a.

An auxiliary mask M1 may be provided over the seed material layer 402a. In some embodiments, the auxiliary mask M1 is patterned so as to cover only part of the seed material layer 402a. The auxiliary mask M1 includes openings O1 through which portions of the seed material layer 402a are exposed. In some embodiments, the portions of seed material layer 402a exposed by the auxiliary mask M1 lie over the TIVs 100 and the conductive posts 217, 227 of the semiconductor dies 210, 220. In some embodiments, the auxiliary mask M1 is produced by a sequence of deposition, photolithography and etching. A material of the auxiliary mask M1 may include a positive photoresist or a negative photoresist. In some embodiments, a conductive material may be formed over the seed material layer 402a in the openings O1. In some embodiments, the conductive material formed in the openings O1 may form via patterns 404 filling the openings O1 of the auxiliary mask M1. In some embodiments, the conductive material may include copper, nickel, tin, palladium, gold, titanium, aluminum, or alloys thereof. In some embodiments, the via patterns 404 may be formed by a plating process. The plating process is, for example, electro-plating, electroless-plating, immersion plating, or the like.

Referring to FIG. 1D and FIG. 1E, the auxiliary mask M1 and the underlying portions of seed material layer 402a may be removed. In some embodiments, the auxiliary mask M1 may be removed or stripped through, for example, etching, ashing, or other suitable removal processes. Upon removal of the auxiliary mask M1, the portions of seed material layer 402a that are not covered by the via patterns 404 are removed to render seed layers 402 disposed between the via patterns 404 and the TIVs 100 or the semiconductor dies 210 and 220. The exposed portions of the seed material layer 402a may be removed through an etching process. In some embodiments, the material of the via patterns 404 may be different from the material of the seed material layer 402a, so the portions of the seed material layer 402a exposed after removal of the auxiliary mask M1 may be removed through selective etching. In some embodiments, depending on the etching conditions adopted, portions of the seed material layer 402a disposed along an edge of the via patterns 404 below the via patterns 404 may also be removed.

Referring to FIG. 1E and FIG. 1F, a seal material layer 406a may be blanketly formed over the package unit PU. The seal material layer 406a may be disposed on the portions of the TIVs 100, the semiconductor dies 210, 220, and the encapsulant 300 left exposed by the via patterns 404 and the seed layers 402. In some embodiments, the seal material layer 406a wraps around the via patterns 404, covering the portions of the via patterns 404 that do not extend over the seed layers 402. For example, the seal material layer 406a may cover side surfaces 404s and top surfaces 404t of the via patterns 404. In some embodiments, side surfaces 404s are considered the surfaces joining the top surfaces 404t with the bottom surfaces 404b. In some embodiments, the seal material layer 406a may enclose the via patterns 404 and the underlying seed layers 402. In some embodiments, the seal material layer 406a includes nickel, titanium, copper, or combinations thereof. In some embodiments, the material of the seal material layer 406a has a stronger tendency towards oxidation than a material of the via patterns 404 to prevent oxidation of the material of the via patterns 404. Standard oxidation potentials (SOP, $E^O$) could be used as a preliminary check parameter to select materials for the seal material layer 406a and the via patterns 404. For example, higher $E^O$ values indicate that the material undergoes a redox reaction more easily, with positive $E^O$ values indicating that oxidation may occur spontaneously and negative $E^O$ values indicating that oxidation may not occur spontaneously. For example, if copper ($E^O$ of Cu/Cu$^{2+}$ =−0.34 volt) is used as material for the via patterns 404, titanium ($E^O$ of Ti/Ti$^{3+}$=+1.37 volt), nickel ($E^O$ of Ni/Ni$^{2+}$ =+0.25 volt), or combinations thereof may be considered suitable candidates for the material of the seal material layer 406a. In some embodiments, interface properties and passivation performance between the material of the seal material layer 404a and subsequently formed dielectric materials may also be taken into account. In some embodiments, the seal material layer 406a and the seed layers 402 are made of the same material. In some alternative embodiments, the seal material layer 406a and the seed layers 402 are made of different material. In some embodiments, the seal material layer 406a is formed by sputtering. In some alternative embodiments, the seal material layer 406a is formed by plating. In some embodiments, the seal material layer 406a may be a composite layer, and may be formed during multiple process steps.

Referring to FIG. 1G, a second mask M2 and a third mask M3 may be stacked over the seal material layer 406a. In some embodiments, the second mask M2 is formed first, and is disposed between the seal material layer 406a and the third mask M3. In some embodiments, the second mask M2 is conformally formed over the seal material layer 406a. That is, as the seal material layer 406a, also the second mask M2 may extend over the encapsulant 300 at different level heights to further wrap the via patterns 404. In some embodiments, the thickness TM2 of the second mask M2 may be substantially uniform over the package unit PU. That is, the second mask M2 may present the same thickness TM2 over the encapsulant 300 and over the side surfaces 404s and top surfaces 404t of the via patterns 404. In some embodiments, a bottom anti-reflective coating (BARC) may be used as the second mask M2. In some embodiments, a material of the second mask M2 includes organic polymers or inorganic dielectric (such as TiN, SiN etc), which have good selectivity for etching with respect to the material of the seal material layer 404a. In some embodiments, the material of the second mask M2 may also have anti-reflective function. Formation of the second mask M2 is not particularly limited, and any suitable process may be applied. For example, the second mask M2 may be formed by spin-coating. The third mask M3 may be formed over the second mask M2. In some embodiments, the third mask M3 may fill the space between adjacent via patterns 404 and be of sufficient thickness to cover the second mask M2 all over the package unit PU. In some embodiments, the third mask M3 includes a positive photoresist or a negative photoresist.

Referring to FIG. 1G to FIG. 1I, in some embodiments, the second mask M2 and the third mask M3 may be patterned to form patterned masks PM2 and PM3, respectively. The patterned mask PM3 may be formed before the patterned mask PM2, and may be used as a master to transfer a pattern to the second mask M2. In some embodiments, the patterned mask PM3 may be formed by exposing and developing the third mask M3. In some embodiments, the patterned mask PM3 includes multiple cap portions disposed over the via patterns 404 and exposing the second mask M2 in regions between the via patterns 404. In some embodiments, the cap portions constituting the patterned mask PM3 may be disconnected from each other. As illustrated in FIG. 1H, before patterning of the second mask M2, portions of the second mask M2 extending between via patterns 404 may be left exposed by the cap portions of the patterned mask PM3. In some embodiments, a post-development baking step of the patterned mask PM3 may be included. In some embodiments, a temperature of the post-development baking step may be higher than a glass transition temperature of the material of the patterned mask PM3, resulting in a reflow of the cap portions of the patterned mask PM3. In some embodiments, performing the post-development baking step at a temperature higher than the glass transition temperature of the material of the patterned mask PM3 may increase a shielding effect of the patterned mask PM3 during a subsequent patterning step of the second mask M2. That is, by reflowing the patterned mask PM3, the portions of the second mask M2 extending over the side surfaces 404s of the via patterns 404 may be better protected during the subsequent patterning step. In some embodiments, the patterned mask PM3 is used to pattern the second mask M2. In some embodiments, the pattern of the patterned mask PM3 is transferred to the second mask M2 to form the patterned mask PM2. That is, after the patterning step, the patterned mask PM2 may include cap portions stacked below the cap portions of the patterned mask PM3. In some embodiments, the patterned mask PM2 consists of disconnected cap portions, each cap portion extending over the side surfaces 404s and the top surface 404t of a via pattern 404. Each cap portion may include a footing section F radially extending around and projecting away from the underlying via pattern 404. The outlines of the cap portions of the patterned mask PM2 may be aligned with the outlines of the cap portions of the patterned mask PM3. In some embodiments, the cap portions of the patterned masks PM2 and PM3 are located on the via patterns 404 and in the region immediately surrounding each via pattern 404. Portions of the seal material layer 406a may be left exposed by the patterned masks PM2 and PM3 in the region between adjacent via patterns 404. In some embodiments, the patterned mask PM2 is formed by removing the portions of the second mask M2 exposed by the cap portions of the patterned mask PM3. In some embodiments, the portions of the second mask M2 are removed after the post-development baking step of the patterned mask PM3. A process for patterning the second mask M2 is not particularly limited. For example, the second mask M2 may be patterned by a descum process (e.g., plasma ashing) or by etching (e.g., with oxidizing agents), however the disclosure is not limited thereto.

Referring to FIG. 1I and FIG. 1J, after formation of the patterned mask PM2 the patterned mask PM3 may be removed, for example via stripping. In some embodiments, the patterned mask PM2 is retained after the patterned mask PM3 is removed. Referring to FIG. 1J and FIG. 1K, in some embodiments the portions of seal material layer 406a exposed by the patterned mask PM2 may be removed, for example via etching. In some embodiments, the seal material layer 406a may be patterned via wet etching. In some embodiments, patterning of the seal material layer 406a may leave seal material patterns 406b covered by the patterned mask PM2. In some embodiments, the footings F of the patterned masks PM2 protrude with respect to the underlying seal material patterns 406b. That is, following the etching step, the seal material patterns 406b may present an undercut with respect to the overlying cap portions of the patterned mask PM2. In some embodiments, a seal material pattern 406b extends over the side surfaces 404s and the top surface 404t of a via pattern 404. In some embodiments, parts of the encapsulant 300, of the semiconductor dies 210, 220, or of the TIVs 100 may be left exposed by the seal material patterns 406b.

Referring to FIG. 1K and FIG. 1L, after formation of the seal material patterns 406b, the patterned mask PM2 may be removed, for example during a descum process. Thereafter, a dielectric material layer 408a may be blanketly formed over the package unit PU. The thickness T1 of the dielectric material layer 408a may be sufficient to cover the via patterns 404 and the seal material patterns 406b. In some embodiments, the dielectric material layer 408a includes polyimide, epoxy resin, acrylic resin, phenol resin, benzocyclobutene (BCB), polybenzoxazole (PBO), or any other suitable polymer-based dielectric material. The dielectric material layer 408a, for example, may be formed by suitable fabrication techniques such as spin-on coating, chemical vapor deposition (CVD), plasma-enhanced chemical vapor deposition (PECVD), or the like.

Referring to FIG. 1L and FIG. 1M, in some embodiments, portions of the dielectric material layer 408a and of the seal material patterns 406b are removed until the top surfaces 404t of the via patterns 404 are exposed. That is, the dielectric material layer 408a may be thinned from an original thickness T1 to a reduced thickness T2. The part of the seal material patterns 406b extending on the top surfaces 404t of the via patterns 404 may be removed in the process. In some embodiments, thinning of the dielectric material layer 408a includes performing a mechanical grinding process and/or a chemical mechanical polishing (CMP) process. Following thinning of the dielectric material layer 408a, a dielectric layer 408 and seal patterns 406 are formed. A seal pattern 406 laterally wraps one via pattern 404 with the underlying seed layer 402. The dielectric layer 408 extends in between adjacent seal pattern 406, laterally encapsulating the via patterns 404, the seal patterns 406 and the seed layers 402. In some embodiments, the seal patterns 406 are interposed between the via patterns 404 and the dielectric layer 408, preventing direct contact between the via patterns 404 and the dielectric layer 408. In some embodiments, the thickness T2 of the dielectric layer 408 is such that the top surfaces 404t and the seal patterns 406 are exposed when viewed from the top. In some embodiments, the seed layers 402, the via patterns 404, the seal patterns 406 and the dielectric layer 408 may be collectively referred to as a first redistribution layer. In some embodiments, the via patterns 404 may be referred to as conductive traces. In the inset in FIG. 1M is illustrated a schematic three-dimensional view of the via pattern 404 and the associated seal pattern 406 enclosed by the dashed line. For the sake of clarity, the dielectric layer 408 is omitted in the inset. In some embodiments, the via pattern 404 is wrapped on the sides by the seal pattern 406, with only the top surface 404t left exposed. As illustrated in FIG. 1M, the seal pattern 406 laterally encapsulates the via pattern 404 and the seed layer 402 (not visible in the inset). In some embodiments, the seal pattern 406 includes a footing portion F formed at the base of the via pattern 404 (around the seed layer 402) and radially extending away from the via pattern 404 and the seed layer 402. In some embodiments, the footing portion F406 protrudes from the rest of the seal pattern 406, extending like a brim over the underlying elements (e.g., the conductive posts 217 or the encapsulant 300). It should be noted that while the via pattern 404 is shown as substantially cylindrical in the inset of FIG. 1M, the disclosure is not limited thereto. In some alternative embodiments, the via pattern 404 may have different shapes (e.g., parallelepiped, truncated pyramid having different polygons as bases, and so on).

Referring to FIG. 1M and FIG. 1N, a seed material layer 410a may be blanketly formed over the first redistribution layer. That is, the seed material layer 410a may extend over the first dielectric layer 408, the via patterns 404 and the seed portions 406. A material and a fabrication method for the seed material layer 410a may be chosen similarly to what previously described for the seed material layer 402a and a description thereof is omitted herein for the sake of brevity. In some embodiments, an auxiliary mask M4 is provided on the seed material layer 410a. The auxiliary mask M4 includes openings O2 exposing portions of the seed material layer 410a overlying the via patterns 404. In some embodiments, the auxiliary mask M4 may be produced similarly to what previously described for the auxiliary mask M1. A conductive material may be formed in the openings O2 to produce routing patterns 412. In some embodiments, the routing patterns 412 are deposited or plated on the portions of seed material layer 410a exposed by the auxiliary mask M4. Thereafter, an auxiliary mask M5 may be formed on the auxiliary mask M4 and the routing patterns 412. The auxiliary mask M5 may present openings O3 exposing portions of the routing patterns 412. That is, the auxiliary mask M5 may partially extend within the openings O2 of the auxiliary mask M4 over the routing patterns 412, and the openings O3 may be encompassed by the openings O2. A conductive material may be disposed in the openings O3 on top of the routing patterns 412 to form via patterns 414. In some embodiments, the routing patterns 412 act as a seed during the formation of the via patterns 414. In some embodiments, the routing patterns 412 and the via patterns 414 may include the same conductive material, and appear integrally formed even if produced via multiple deposition or plating steps. In some alternative embodiments, an interface may be visible between the via patterns 414 and the routing patterns 412.

Referring to FIG. 1N and FIG. 1O, in some embodiments the auxiliary masks M4 and M5 and the underlying portions of seed material layer 410a may be removed. In some embodiments, the material of the auxiliary masks M4 and M5 may be the same, and the two masks M4 and M5 may be removed under the same conditions. In some embodiments, the portions of the seed material layer 410a exposed after removal of the auxiliary masks M4 and M5 are removed, while the portions of the seed material layer 410a underlying the routing patterns 412 are retained to form seed layers 410. The seed layers 410 extend over the top surfaces 404t of the via patterns 404, in between the via patterns 404 and the routing patterns 412. As such a via pattern 404 is surrounded on all sides by the seed layers 402, 410 and the seal pattern 406. The seed layer 402 extends below and covers the bottom of the via pattern 404, the seed layer 410 extends on and covers the top of the via pattern 404, and the seal pattern 406 extends on and covers the sides of the via pattern 404. With this configuration, the protection of the via patterns 404 against stress may be enhanced, and a tendency to form gaps due (e.g., due to oxidation of the conductive material of the via patterns 404) may be reduced. As illustrated in FIG. 1O, the seed layers 410 further extend between the routing patterns 412 and the dielectric layer 408.

Referring to FIG. 1O and FIG. 1P, a seal material layer 416a may be blanketly formed over the dielectric layer 408, the routing patterns 412 and the via patterns 414. Patterned masks PM6 and PM7 may be disposed on the seal material layer 416a. Manufacturing of the seal material layer 416a and of the patterned masks PM6, PM7 may be performed as previously described for the seal material layer 402a and the patterned masks PM2 and PM3 with reference to FIG. 1F to FIG. 1I, and a detailed description thereof is omitted herein. The patterned masks PM6 and PM7 may expose portions of the seal material layer 416a in between adjacent routing patterns 412. With reference to FIG. 1P and FIG. 1Q, the patterned mask PM7 may be used to produce the patterned mask PM6, then removed. The patterned mask PM6, in turn, may be used to pattern the seal material layer 416a to produce seal material patterns 416b, and be removed once the seal material patterns 416b are formed. Referring to FIG. 1Q and FIG. 1R, a dielectric layer 418 may be formed similarly to what was previously discussed for the dielectric layer 408. In some embodiments, formation of the dielectric layer 418 includes a planarization step during which the portions of the seal material patterns 416b extending on the top surfaces 414t of the via patterns 414 are removed. That is, the dielectric layer 418 may laterally encapsulate the seed layers 410, the routing patterns 412, the via patterns 414 and the seal patterns 416, while the top surfaces 414t of the via patterns 414 and portions of the seal patterns 416 may be left exposed by the dielectric layer 418. The seed layers 410, the routing patterns 412, the via patterns 414, the seal patterns 416 and the dielectric layer 418 may be collectively referred to as a second redistribution layer. In some embodiments, routing patterns 412 together with the overlying via patterns 414 may be referred to as conductive traces.

Referring to FIG. 1S, a third redistribution layer may be formed over the second redistribution layer. Seed layers 420 and routing patterns 422 may be formed similarly to what previously described. The seed layers 420 may extend over the top surfaces 414t of the via patterns 414 and portions of the dielectric layer 418. The routing patterns 422 may be formed on the seed layers 420. By extending on top of the top surfaces 414t, the seed layers 420 complete a sealing of the via patterns 414 and the routing patterns 412. That is, the seed layers 410 and 420 and the seal pattern 416 may surround the routing patterns 412 and the via patterns 414, preventing direct contact between the routing patterns 412 and the via patterns 414. In some embodiments, seal patterns 424 may be formed on top of the routing patterns 422, and the seed layers 420, the routing patterns 422 and the seal patterns 424 may be embedded in a dielectric layer 426. The seal patterns 424 may be formed through the use of auxiliary patterned masks (not shown), similarly to what described for the seal patterns 406 and 416. A difference between the seal patterns 424 and the seal patterns 416 or 406 is that the seal patterns 424 extend along the side surfaces 422s and over the entire top surfaces 422t of the routing patterns 422. That is, formation of the dielectric layer 426 does not involve exposing the top surfaces 422t of the routing patterns 422. Rather, a dielectric material layer (not shown) may be formed to completely cover the seal patterns 424, and openings O4 may be produced in the dielectric material layer to form the dielectric layer 426. The openings O4 may expose portions of the seal layers 424 extending on the top surfaces 422t of the routing patterns 422. Alternatively stated, even though a planarization process may be performed on the dielectric material layer, this is done in such a way to preserve the seal patterns 424 on top of the routing patterns 422. In some embodiments, formation of the third redistribution layer completes a redistribution structure 400. It should be noted that in FIG. 1S the redistribution structure 400 is shown to include three redistribution layers for illustrative purpose only, without limiting the disclosure. In some embodiments, more or fewer redistribution layers may be included. In some embodiments, the number of redistribution layers can be varied based on the circuit design. In some embodiments, the routing patterns 422 may be referred to as conductive traces.

In some embodiments, referring to FIG. 1T, under-bump metallurgies 500 may be conformally formed in the openings O4 of the outermost dielectric layer 426 exposing the seal patterns 424. In some embodiments, the under-bump metallurgies 500 further extend over portions of the outermost dielectric layer 426 surrounding the openings O4. In some embodiments, the under-bump metallurgies 500 include a seed layer 502 and a metallic layer 504. In some embodiments, connectors 600 are formed over the under-bump metallurgies 500. The connectors 600 may include solder balls, ball grid array (BGA) connectors, metal pillars, controlled collapse chip connection (C4) bumps, micro bumps, bumps formed via electroless nickel—electroless palladium—immersion gold technique (ENEPIG), a combination thereof (e.g., a metal pillar with a solder ball attached), or the like. The under-bump metallurgies 500 and the connectors 600 may be electrically connected to the TIVs 100 and the semiconductor dies 210, 220 via the redistribution structure 400.

In some embodiments, referring to FIG. 1T and FIG. 1U, a singulation step is performed to separate the individual semiconductor packages 10, for example, by cutting through the reconstructed wafer RW along the scribe lanes SC arranged between individual package units PU. In some embodiments, adjacent semiconductor packages 10 may be separated by cutting through the scribe lanes SC of the reconstructed wafer RW. In some embodiments, the singulation process typically involves performing a wafer dicing process with a rotating blade and/or a laser beam. In some embodiments, the carrier C is separated from the semiconductor packages 10 following singulation. When the de-bonding layer DB (e.g., the LTHC release layer) is included, the de-bonding layer DB may be irradiated with a UV laser so that the carrier C and the de-bonding layer DB are easily peeled off from the semiconductor packages 10. Nevertheless, the de-bonding process is not limited thereto, and other suitable de-bonding methods may be used in some alternative embodiments.

After the singulation step and removal of the carrier C, a plurality of semiconductor packages 10 are obtained. An exemplary cross-sectional view of the semiconductor package 10 according to some embodiments of the disclosure is illustrated in FIG. 1U. Based on the above, a semiconductor package 10 includes TIVs 100 and semiconductor dies 210, 220 wrapped on the sides by an encapsulant 300 and electrically connected to a redistribution structure 400. The redistribution structure 400 includes multiple redistribution layers. The via patterns 404, 414, and the routing patterns 412, 422 of the redistributions structure 400 are separated from the corresponding dielectric layers 408, 418, 426 by the seed layers 402, 410, 420 and the seal patterns 406, 416, 424. In some embodiments, encapsulation with suitable materials of the routing patterns 412, 422 and the via patterns 404, 414 reduces the occurrence of oxidative damages to the conductive traces of the redistribution structure 400, enhancing the reliability and the lifetime of the semiconductor package 10. In some embodiments, the seal patterns 406, 416, 424 disposed between the dielectric layers 408, 418, 426 and the via patterns 404, 414 and the routing patterns 412, 422 may increase the adhesion of the sidewalls of the via patterns 404, 414 and the routing patterns 412, 422 to the dielectric layers 408, 418, 426, further stabilizing the structure of the semiconductor package 10 and increasing its reliability. In some embodiments, upon subjecting the semiconductor package 10 to high temperature stability tests for prolonged times (e.g., at 175° C. for 500-1000 hours), SEM analysis may reveal oxidation of the seal patterns 406, 416, 424 with little to no voids formed in the routing patterns 412, 422 or the via patterns 404, 414 from oxidative damage.

Figure 2A:
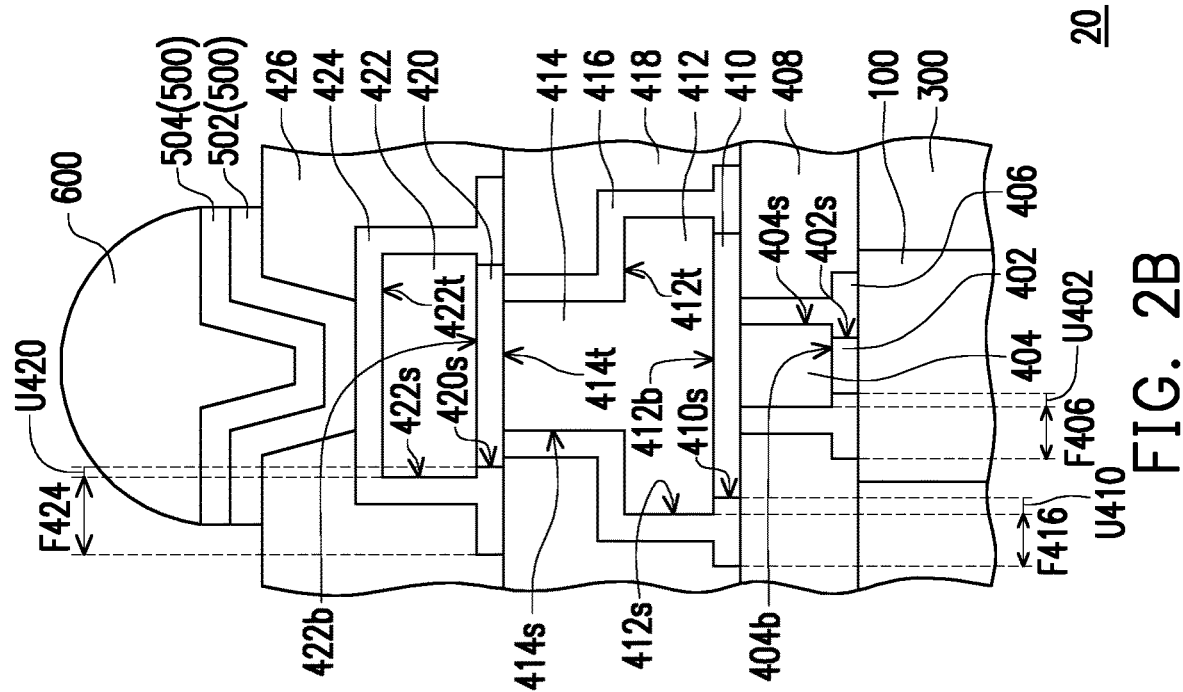
FIG. 2A to FIG. 2D are schematic cross-sectional enlarged views illustrating a portion of a semiconductor package in accordance with some embodiments of the disclosure.

FIG. 2A through FIG. 2D illustrate schematic cross-sectional views of portions of semiconductor packages 10, 20, 30, and 40, respectively, according to some embodiments of the present disclosure. The portions of the semiconductor packages 10, 20, 30, 40, illustrated in FIG. 2A through FIG. 2D correspond to the area A1 enclosed by the dashed line in FIG. 1U. It should be noted that even though at the bottom of FIG. 2A through FIG. 2D, a portion of the encapsulant 300 and a portion of a TIV 100 are illustrated, the features described could equally apply to portions of the redistribution structure 400 connected to the semiconductor dies 210, 220. For example, in place of the TIV 100 there could be a conductive post 217, 227 of the semiconductor dies 210, 220, or any other conductive element to which the redistribution structure 400 may be connected. Referring to FIG. 2A, in some embodiments, the seed layer 402 is disposed on the TIV 100, and the via pattern 404 is stacked on the seed layer 402. The side surfaces 402s, 404s of the seed layer 402 and the via pattern 404 are aligned with respect to each other. That is, the seed layer 402 and the via pattern 404 may have substantially coincident footprints on the plane defined by the top surface 100t of the TIV 100 and the top surface 300t of the encapsulant 300. In some embodiments, the seal pattern 406 covers the side surfaces 402s, 404s, and extends throughout the first redistribution layer in a vertical direction, spanning from the TIV 100 to the seed layer 410 of the second redistribution layer. In some embodiments, the seal pattern 406 presents a footing portion F406 radially extending on the TIV 100 and/or the encapsulant 300 away from the seed layer 402 and the via pattern 404. In some embodiments, the footing portion F406 protrudes with respect to upper portions of the seal pattern 406. That is, the outer surface 406o of the seal pattern 406 may include a first portion 406o1 which runs substantially parallel to the side surface 404s of the via pattern 404 at a distance corresponding to the thickness T406 of the seal pattern 406, and a second portion 406o2 which is also parallel to the side surface 404s of the via pattern 404 but is located at a distance corresponding to the size of the footing portion F406, where the size of the footing portion F406 is larger than the thickness T406. In some embodiments, the thickness T406 may be in the range from 0.05 micrometers to 0.1 micrometers. In some embodiments, the size of footing portion F406 may be between 0.05 micrometer to 0.2 micrometer larger than the thickness T406. In some embodiments, the size of the footing portion F406 may depend on the pitch of the conductive traces of the redistribution structure 400. In some embodiments, the seal pattern 416 and 424 may present footing portions F416 and F422 similarly to what just described for the seal pattern 406.

In some embodiments, the seed layer 410 extends on the via pattern 404, covering the top surface 404t and partially extending on the dielectric layer 408. The routing pattern 412 is disposed on the seed layer 410, and side surfaces 410s, 412s of the seed layer 410 and the routing pattern 412 may be aligned with respect to each other. That is, the seed layer 402 and the via pattern 404 may have substantially coincident footprints on the plane defined by the top surfaces of the TIV 100 and the encapsulant 300. The via pattern 414 is disposed on the routing pattern 412, and its footprint may be smaller than the footprint of the routing pattern 412. In some embodiments, the footprint of the via pattern 414 is (completely) encompassed by the footprint of the routing pattern 412. The via pattern 414 may leave exposed a portion of the top surface 412*t* of the routing pattern 412. The seal pattern 416 may extend along the side surfaces 410*s*, 412*s* and 414*s* of the seed layer 410, the routing pattern 412 and the via pattern 414, respectively, and along the portion of the top surface 412*t* left exposed by the via pattern 414. The top surface 414*t* of the via pattern 414 may be sealed by the seed layer 420. The seal patterns 406, 416, 424 laterally wrap the via patterns 404, 414, and the routing patterns 412, 422. In some embodiments, the outer surface 416*o* of the seal pattern 416 may include a first portion 416*o*1, a second portion 416*o*2 and a third portion 416*o*3 running substantially parallel to the side surface 414*s* of the via pattern 414. The distance between the side surface 414*s* or 412*s* and the first portion 416*o*1 or the second portion 416*o*2, respectively, may be equal to the thickness T416 of the seal pattern 416. The distance between the third portion 416*o*3 and the side surface 410*s* of the seed layer or the side surface 412*s* of the routing pattern may be greater than the thickness T416. In the topmost redistribution layer, the seal pattern 424 further covers the top surface 422*t* of the routing pattern 422. That is, the seal pattern 424 may separate the routing pattern 422 from the dielectric layer 426 in which the routing pattern 422 is embedded. The under-bump metallurgy 500 may be disposed on the portion of the seal pattern 424 exposed by the opening O4, and the connector 600 may be disposed on the under-bump metallurgy 500.

Figure 2B:
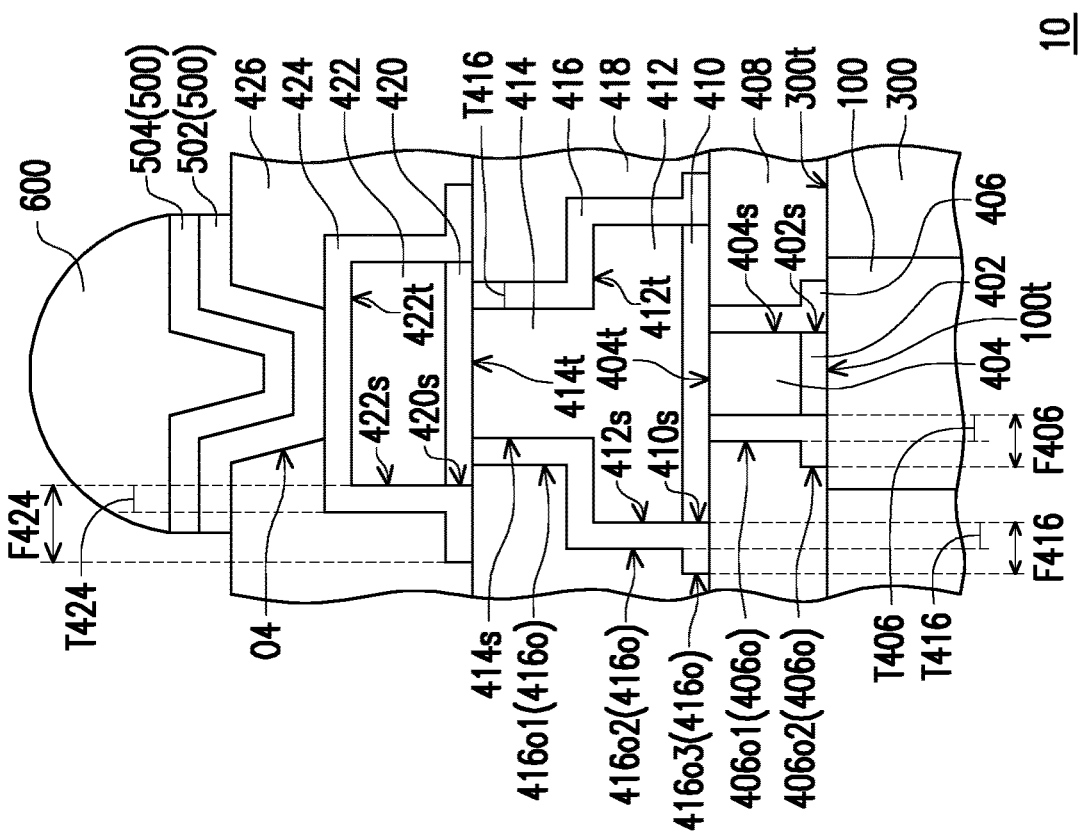

Referring to FIG. 2B, the semiconductor package 20 may be similar to the semiconductor package 10 of FIG. 2A, and the same or similar reference numerals are used to indicate the same or similar corresponding parts in the two packages. In some embodiments, the semiconductor package 20 may be fabricated following a similar process as described with reference to FIG. 1A to FIG. 1U for the semiconductor package 10. A difference between the semiconductor package 20 and the semiconductor package 10 lies in a difference in footprints between the via pattern 404 and the underlying seed layer 402. That is, during the etching step to pattern the seed material layer 402*a* (previously described with reference to FIG. 1D and FIG. 1E), portions of the seed material layer 402*a* underlying or adjacent to the side surface 404*s* of the via pattern 404 may also be removed, generating an undercut U402 of the seed layer 402 with respect to the via pattern 404. After the etching step, the via patterns 404 may slightly protrude with respect to the underlying seed layers 402, and the corresponding side surfaces 404*s* and 402*s* of a via pattern and the underlying seed layer 404 may be misaligned with respect to each other. The footprint of one via pattern 404 may be greater than the footprint of the underlying seed layer 402, and the span of the underlying seed layer 402 may be contained in the span of the overlying via pattern 404. In some alternative embodiments, the seal pattern 406 may compensate the undercut U402 of the seed layer 402, and partially extend below the via pattern 404. That is, the seal pattern 406 may extend between the portion of the bottom surface 404*b* not covered by the seed layer 402 and the TIV 100 or the encapsulant 300. In some embodiments, the seal pattern 406 also includes the footing F406 previously described with reference to FIG. 2A. In some embodiments, the seed layers 410 and 420 may present similar undercuts U410, U420 with respect to the overlying routing patterns 412 and 422. That is, the side surfaces 410*s* and 422*s* may be misaligned with respect to the side surfaces 412*s* and 422*s*, respectively. Consequently, the seal patterns 416 and 424 may partially wrap below the routing patterns 412 and 422, respectively.

Figures 2C, 2D:
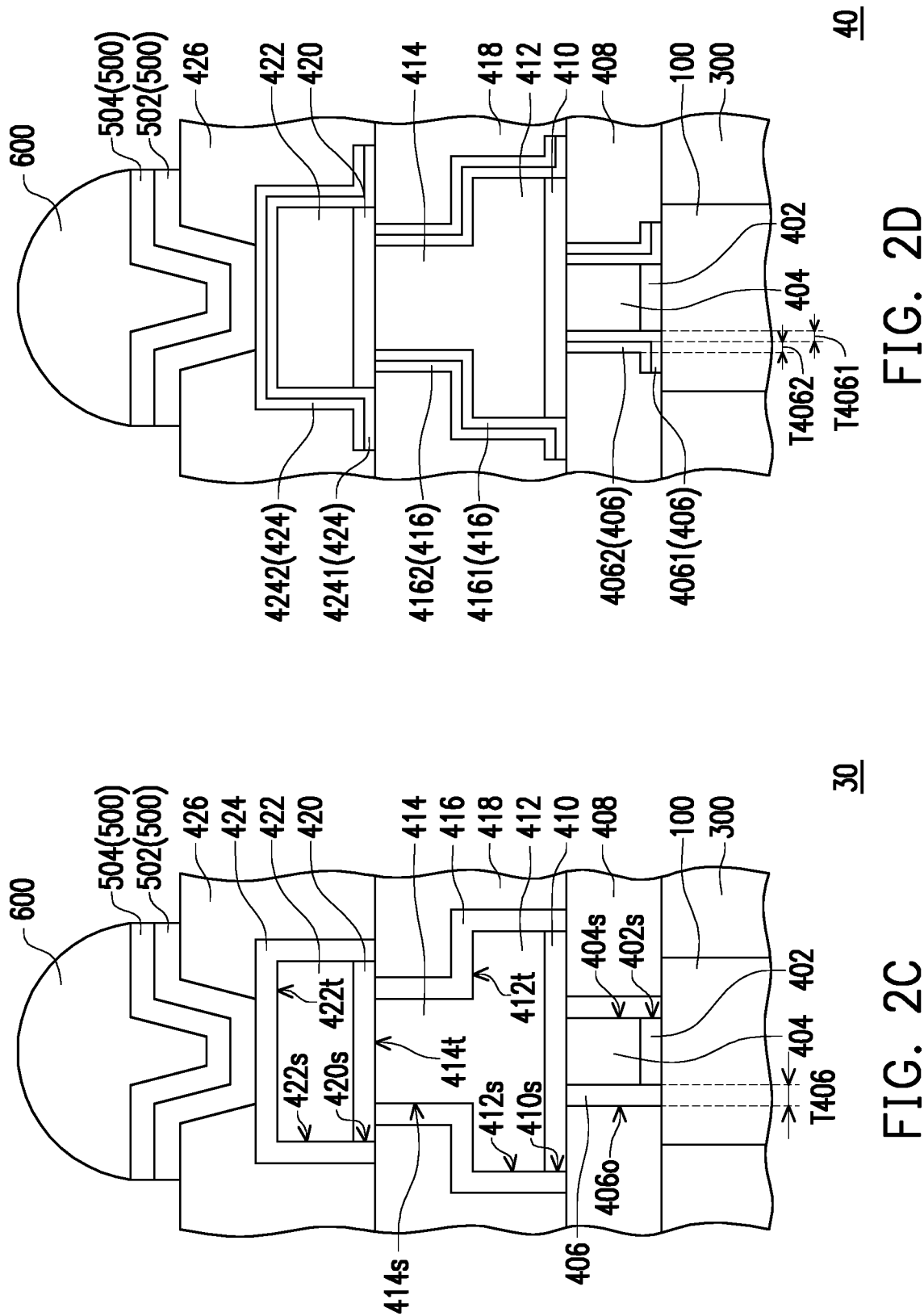

Referring to FIG. 2C, the semiconductor package 30 may be similar to the semiconductor package 10 of FIG. 2A, and the same or similar reference numerals are used to indicate the same or similar corresponding parts in the two packages. A difference between the semiconductor package 10 and the semiconductor package 30 is that the seal pattern 406 may not include the footing portion F406 (shown in FIG. 2A). That is, the outer surface 406*o* may be substantially straight, and running substantially at the same distance (the thickness T406) from the side surfaces 402*s* or 404*s* of the seed layer 402 and the via pattern 404. Similarly, the seal patterns 416 and 424 may not include the corresponding footing portions F416 and F424 (shown in FIG. 2A). In some embodiments, seal patterns 406, 416 or 424 not including the footing portions F406, F416, or F424 may be produced via a plating process using the via patterns 404, 414 and/or the routing patterns 412, 422 as the seed patterns. For example, the seal patterns 406, 416 or 424 may be produced by electro-less deposition of titanium, nickel, or a combination thereof.

Referring to FIG. 2D, the semiconductor package 40 may be similar to the semiconductor package 10 of FIG. 2A, and the same or similar reference numerals are used to indicate the same or similar corresponding parts in the two packages. In some embodiments, the semiconductor package 40 may be fabricated following a similar process as described with reference to FIG. 1A to FIG. 1U for the semiconductor package 10. A difference between the semiconductor package 40 of FIG. 2D and the semiconductor package 10 of FIG. 2A lies in the seal pattern 406 being a composite structure. For example, the seal pattern 406 includes sequentially stacked layers 4061 and 4062. In some embodiments, the stacked layers 4061, 4062 include different materials, and are produced during different deposition or plating steps. The layer 4061 may be referred to as an inner layer and the layer 4062 may be referred to as an outer layer. In some embodiments, intermediate layers (not shown) may be disposed between the inner layer 4061 and the outer layer 4062. In some embodiments, the inner layer 4061 may include titanium, and the outer layer 4062 may include copper. In some embodiments, the material of the outer layer 4062 may be the same as the material of the via pattern 404. In some embodiments, the thickness T4061 and the thickness T4062 of the layers 4061 and 4062 may independently be in the range from 0.01 micrometer to 0.1 micrometer. Similarly, the seal patterns 416 and 424 may be constituted by stacked layers 4161, 4162 and 4241, 4242, respectively.

Figure 3A:
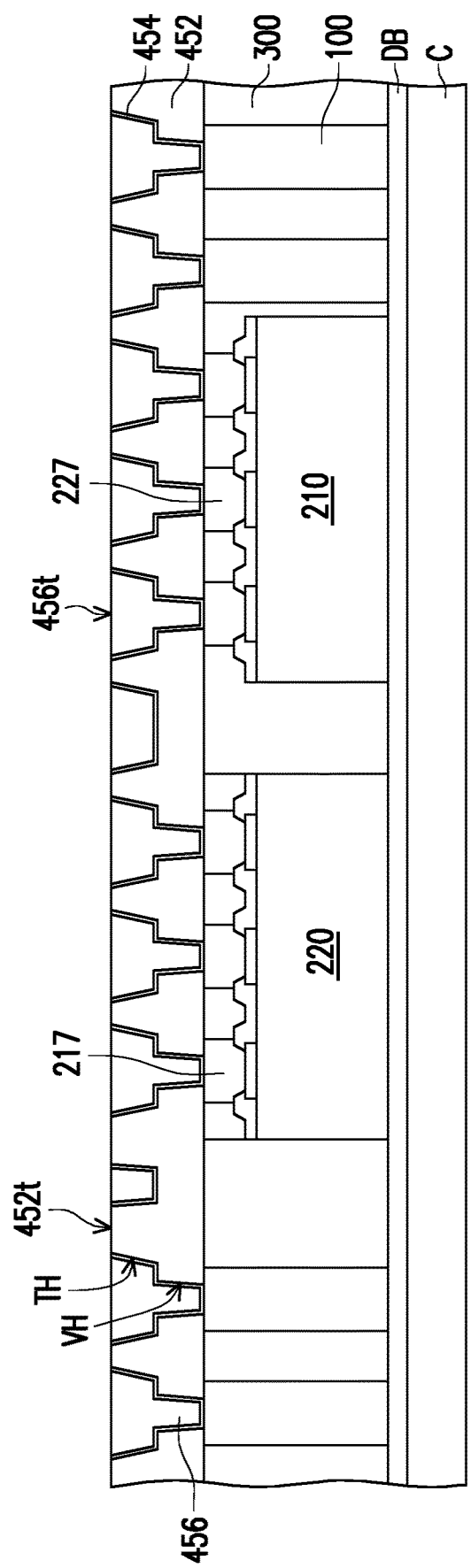
FIG. 3A to FIG. 3C are schematic cross-sectional views illustrating a manufacturing process of a semiconductor package in accordance with some embodiments of the disclosure.
Figure 3B:
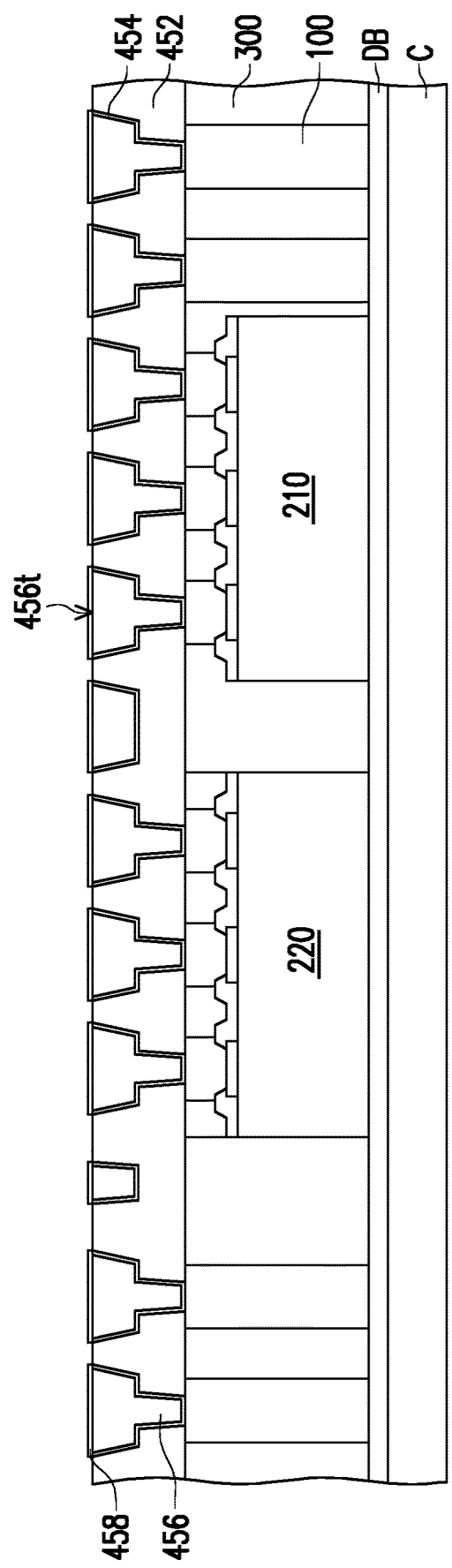
Figure 3C:
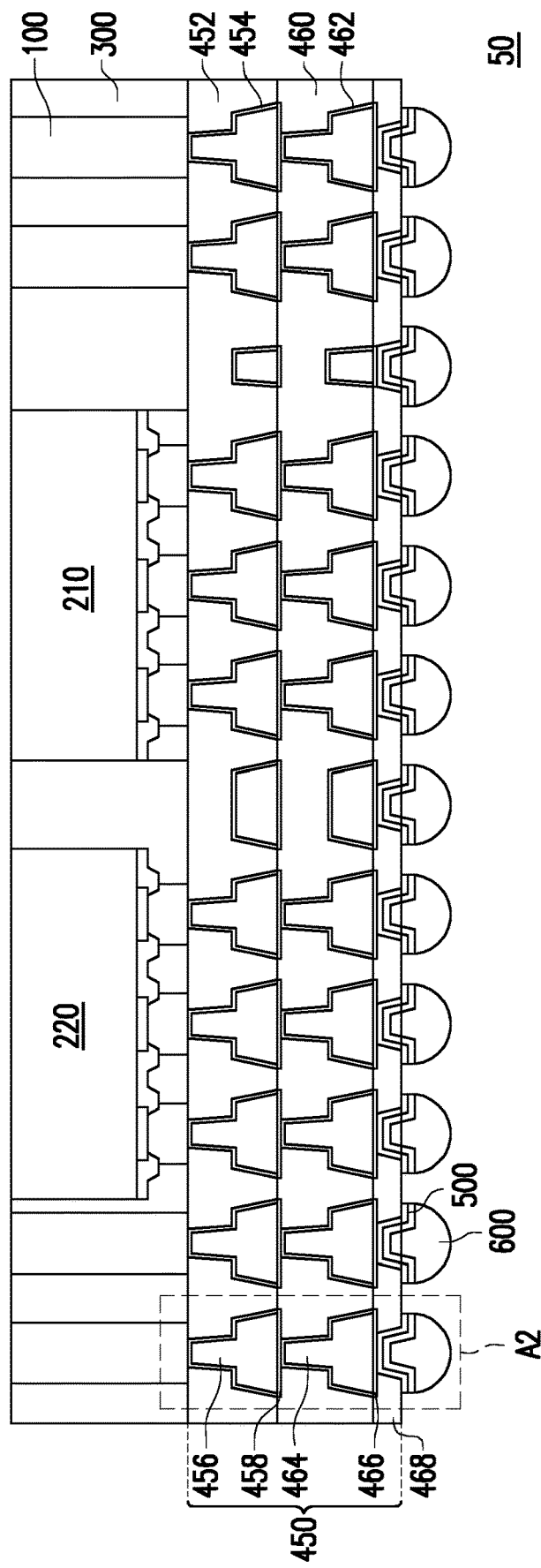

FIG. 3A through FIG. 3C are schematic cross-sectional views illustrating structures produced during a manufacturing process of a semiconductor package 50 (shown in FIG. 3C). The structure shown in FIG. 3A may be produced by forming a first redistribution layer on the structure of FIG. 1C, for example via a dual-damascene process. Briefly, a dielectric material layer 452*a* (not shown) may be blanketly formed over the TIVs 100, the semiconductor dies 210, 220 and the encapsulant 300. Thereafter, the dielectric material layer 452*a* may be patterned to form the dielectric layer 452 including via holes VH and trench holes TH. The via holes VH may cross the dielectric layer 452 for its entire thickness, while the trench holes TH may penetrate through only an upper portion (further away from the semiconductor dies 210, 220) of the dielectric layer 452. Once both the via holes VH and the trench holes TH are formed, the via holes VH may appear as extensions of the trench holes TH towards the TIVs 100 or the semiconductor dies 210, 220. In some embodiments, portions of the TIVs 100 and the conductive posts 217, 227 of the semiconductor dies 210, 220 are exposed by the via holes VH. In some embodiments, the via holes VH and the trench holes TH may have a tapered profile. That is, the sidewalls of the via holes VH and the trench holes TH may be not aligned with respect to a direction normal to the top surface 452t of the dielectric layer 452. In some embodiments, the via holes VH may be formed before the trench holes TH. In some alternative embodiments, the trench holes TH may be formed before the via holes VH. A seed material layer (not shown) may be blanketly formed over the dielectric layer 452 to conformally line the via holes VH and the trench holes TH. The seed material layer may further extend on the top surface 452t of the dielectric layer 452 in between adjacent trench holes TH. A conductive material may be formed on the seed material layer, for example via plating or deposition. In some embodiments, the conductive material may be formed so as to overfill the trench holes TH and the via holes VH, and further extend on the top surface 452t of the dielectric layer 452. Thereafter, a planarization process may be performed to remove the portions of the conductive material and the seed material layer extending on the top surface 452t of the dielectric layer, leaving seed layers 454 and conductive traces 456 extending within the trench holes TH and the via holes VH but not on the top surface 452t of the dielectric layer 452. In some embodiments, top surfaces 456t of the conductive traces 456 may be substantially coplanar with the top surface 452t of the dielectric layer 452. The seed layers 454 may be disposed below the conductive traces 456 and wrap the conductive traces 456 along the sides, leaving the top surfaces 456t exposed.

Referring to FIG. 3A and FIG. 3B, a seal pattern 458 may be formed on the exposed surfaces 456t of the conductive traces 456. In some embodiments, the seal pattern 458 may be directly grown on the conductive traces 456, for example during a plating step using the conductive traces as a seed. In some alternative embodiments, the seal pattern 458 may be formed by patterning a seal material layer (not shown) following a process similar to what was previously described with reference to FIG. 1F to FIG. 1K. Referring to FIG. 3B and FIG. 3C, a second redistribution layer may then be formed over the first redistribution layer and the seal pattern 458 following a similar process as described for the first redistribution layer with reference to FIG. 3A. The second redistribution layer may include a dielectric layer 460, seed layers 462, and conductive traces 464. The seal patterns 458 may be embedded in the dielectric layer 460, and may prevent direct contact of the conductive traces 456 with the dielectric layer 460. The seed layers 462 wrap the conductive traces 464, and are in contact with the seal patterns 458. That is, a seed layer 462 and a seal pattern 458 may be disposed between two stacked conductive traces 456 and 464. Seal patterns 466 may be formed on the top surfaces of the conductive traces 464 which are left exposed by the seed layers 462. An outermost dielectric layer 468 may be formed on top of the second redistribution layer, and the seal pattern 466 may be embedded in the outermost dielectric layer 468. The outermost dielectric layer 468 may include openings exposing portions of the seal patterns 466. Under-bump metallurgies 500 may be formed in the openings, contacting the conductive traces 464 through the seal patterns 466. Connectors 600 may be formed on the under-bump metallurgies 500, allowing integration of the semiconductor package 50 into larger devices. While the redistribution structure 450 is shown in FIG. 3C as two redistribution layers and an outermost dielectric layer 468, the disclosure is not limited thereto. In some alternative embodiments, the number of redistribution layers is adapted according to the design and routing requirement. After formation of the connectors 600, a singulation step and debonding of the carrier C may be performed to produce semiconductor packages 50.

FIG. 4A and FIG. 4B illustrate schematic cross-sectional views of portions of semiconductor packages 50 and 60, respectively, according to some embodiments of the present disclosure. The portions of the semiconductor packages 50 and 60 illustrated in FIG. 4A and FIG. 4B correspond to the area A2 enclosed by the dashed line in FIG. 3C. It should be noted that even though at the bottom of FIG. 4A and FIG. 4B, a portion of the encapsulant 300 and a portion of a TIV 100 are illustrated, the features described could equally apply to portions of the redistribution structure 450 connected to the semiconductor dies 210, 220. For example, in place of the TIV 100 there could be a conductive post 217 or 227 of the semiconductor die 210 or 220, or any other conductive element to which the redistribution structure 450 may be connected. Referring to FIG. 2A, a conductive trace 456 may include a via pattern 456V and a routing pattern 456T. The via pattern 456V and the routing pattern 456T may be constituted by a single block of conductive material (integrally formed). The via pattern 456V may protrude from the routing pattern 456T towards the TIV 100, extending through a part of the dielectric layer 452 that is not reached by the routing pattern 456T. The conductive trace 456 is separated by the dielectric layers 452, 460 by the seed layer 454 and by the seal pattern 458. The seed layer 454 may separate the conductive trace 456 from the dielectric layer 452, and the seal pattern 458 separates the conductive trace 456 from the dielectric layer 460. That is, the seed layer 454 may contact both the routing pattern 456T and the via pattern 456V, while the seal pattern 458 may contact the routing pattern 456T but not the via pattern 456V. The seal pattern may be embedded in the dielectric layer 460. A portion of the seed layer 462 is disposed between the seal pattern 458 and the via pattern 464V of the conductive trace 464. The seed layer 462 wraps the conductive trace 464 preventing direct contact with the dielectric layer 460, and the seal pattern 466 protects the routing pattern 464T from contacting the dielectric layer 468. In the semiconductor package 50 illustrated in FIG. 4A, the seal patterns 458, 466 extend over the underlying conductive traces 456, 464 and the corresponding seed layers 454, 462. This configuration may be obtained, for example, when the seal patterns 458, 466 are formed by plating (e.g., via electroless deposition of titanium, nickel, or combinations thereof), or by careful shaping of the patterned masks (not shown) used to pattern the seal material layers (not shown) from which the seal patterns 458, 466 are formed. In some alternative embodiments, as illustrated in FIG. 4B, the seal patterns 458, 466 may extend further than the underlying seed layers 454, 462, being at least partially disposed on the underlying dielectric layers 452, 460. That is, the seal patterns 458, 466 may present footing portions F458, F466 protruding with respect to the underlying seed layers 454 and 462. For example, the footing portion F458 may be disposed on the dielectric layer 452, and the footing portion F466 may be disposed on the dielectric layer 460. In some embodiments, formation of the footing portions F458, F466 depends on the relative size of the patterned masks (not shown) used to pattern the seal material layers (not shown) and the underlying conductive traces 456, 464 and seed layers 454, 462.

In accordance with some embodiments of the disclosure, a semiconductor package includes a semiconductor die and a redistribution structure. The redistribution structure is electrically connected to the semiconductor die. The redistribution structure includes dielectric layers, conductive traces and seal patterns. The conductive traces are embedded in the dielectric layers. At least one conductive trace of the conductive traces includes a via pattern and a routing pattern. The seal patterns are disposed on the conductive traces. One seal pattern of the seal patterns is disposed between a top surface of the routing pattern and a first dielectric layer of the dielectric layers.

In accordance with some embodiments of the disclosure, a semiconductor package includes a semiconductor die and a redistribution structure. The redistribution structure is electrically connected to the semiconductor die. The redistribution structure includes dielectric layers, conductive traces, seed layers and seal patterns. The conductive traces are embedded in the dielectric layers. The seed layers are disposed in direct contact with the conductive traces. The seal patterns are disposed in direct contact with the conductive traces. A material of the conductive traces is different from a material of the seed layers and a material of the seal patterns. The seed layers and the seal patterns isolate the conductive traces from the surrounding dielectric layers.

In accordance with some embodiments of the disclosure, a manufacturing method of a semiconductor package includes at least the following steps. A semiconductor die is provided. The semiconductor die is encapsulated in the encapsulant. A redistribution structure is formed on the encapsulant. Forming the redistribution structure includes at least the following steps. Conductive traces are formed. The conductive traces are embedded in dielectric layers and electrically connected to the semiconductor die. Seal patterns are formed on the conductive traces. The seal patterns separate top surfaces of the conductive traces from the dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die; and
   a redistribution structure electrically connected to the semiconductor die, the redistribution structure comprising:
      dielectric layers;
      conductive traces embedded in the dielectric layers, wherein at least one conductive trace of the conductive traces includes a via pattern and a routing pattern; and
      seal patterns disposed on the conductive traces,
   wherein one seal pattern of the seal patterns is disposed between a top surface of the routing pattern and a first dielectric layer of the dielectric layers,
   a side surface of the routing pattern joins the top surface of the routing pattern with an opposite bottom surface of the routing pattern, and
   an outer surface of the one seal pattern comprises a first portion and a second portion, the first portion runs substantially parallel to the side surface of the routing pattern at a distance from the side surface of the routing pattern corresponding to the thickness of the one seal pattern, and the second portion runs substantially parallel to the side surface of the routing pattern at a distance from the side surface larger than the thickness of the one seal pattern.

2. The semiconductor package of claim 1, wherein the at least one conductive trace is embedded in the first dielectric layer.

3. The semiconductor package of claim 1, wherein the first dielectric layer is stacked on a second dielectric layer of the dielectric layers, the redistribution structure further comprises seed layers, and one seed layer of the seed layers is disposed between the bottom surface of the routing pattern and the second dielectric layer.

4. The semiconductor package of claim 3, wherein the side surface of the routing pattern joining the top surface and the bottom surface of the routing pattern is aligned with respect to a side surface of the one seed layer.

5. The semiconductor package according to claim 3, wherein the side surface of the routing pattern joining the top surface and the bottom surface of the routing pattern is misaligned with respect to a side surface of the one seed layer.

6. The semiconductor package according to claim 1, wherein the one seal pattern further extends underneath the routing pattern.

7. The semiconductor package according to claim 1, wherein the via pattern is disposed on the routing pattern.

8. A semiconductor package, comprising:
   a semiconductor die; and
   a redistribution structure electrically connected to the semiconductor die, the redistribution structure comprising:
      dielectric layers;
      conductive traces embedded in the dielectric layers;
      seed layers disposed in direct contact with the conductive traces; and
      seal patterns disposed in direct contact with the conductive traces,
   wherein a material of the conductive traces is different from a material of the seed layers and a material of the seal patterns, the material of the seal patterns has a stronger tendency towards oxidation than the material of the conductive traces, and the seed layers and the seal patterns completely isolate the conductive traces from the surrounding dielectric layers.

9. The semiconductor package of claim 8, wherein a first seed layer covers a bottom surface of a first conductive trace, and a first seal pattern covers a top surface of the first conductive trace.

10. The semiconductor package of claim 9, wherein the first seal pattern further covers side surfaces of the first conductive trace, and the side surfaces of the first conductive trace join the top surface with the bottom surface of the first conductive trace.

11. The semiconductor package of claim 10, wherein the first conductive trace is embedded in a first dielectric layer, and the first dielectric layer extends on top of the first seal pattern.

12. The semiconductor package of claim 9, wherein the first seed layer further covers side surfaces of the first conductive trace, the side surfaces joining the top surface with the bottom surface.

13. The semiconductor package of claim 8, wherein a first seal pattern is in direct contact with a first conductive trace, the first seal pattern includes a first layer and a second layer, the first layer is disposed between the second layer and the first conductive trace, a material of the first layer is different from a material of the second layer and from a material of the conductive trace.

14. The semiconductor package of claim 8, wherein a first seed layer covers a bottom surface of a first conductive trace, a second seed layer covers a top surface of the first conductive trace, and a first seal pattern covers side surfaces of the first conductive trace, the side surfaces joining the top surface with the bottom surface.

15. A semiconductor package, comprising:
a semiconductor die; and
a redistribution structure electrically connected to the semiconductor die, the redistribution structure comprising:
a first dielectric layer;
a routing pattern embedded in the first dielectric layer and having a top surface, a bottom surface opposite to the top surface, and a side surface joining the bottom surface to the top surface, the bottom surface being closer to the semiconductor die than the top surface; and
a first seal pattern, completely separating the top surface of the routing pattern from the first dielectric layer and further extending on the side surface of the routing pattern, wherein the first seal pattern includes a conductive material having a higher standard oxidation potential than a conductive material of the routing pattern.

16. The semiconductor package of claim 15, wherein the redistribution structure further comprises a via pattern, and the routing pattern extends over the via pattern.

17. The semiconductor package of claim 15, further comprising a second seal pattern conformally disposed on the first seal pattern and comprising a different conductive material than the first seal pattern.

18. The semiconductor package of claim 17, wherein the routing pattern and the second seal pattern comprise copper.

19. The semiconductor package of claim 18, wherein the first seal pattern comprises titanium, nickel, or a combination thereof.

20. The semiconductor package of claim 15, further comprising:
a seed layer extending on the bottom surface of the routing pattern; and
a second dielectric layer;
wherein the first dielectric layer extends on the second dielectric layer, and the first seal pattern comprises a footing portion extending on the second dielectric layer protruding away from the seed layer.

* * * * *